(12) United States Patent
Matsumura et al.

(10) Patent No.: US 9,509,058 B2
(45) Date of Patent: Nov. 29, 2016

(54) HIGH-FREQUENCY MODULE AND METHOD FOR MANUFACTURING THE SAME

(71) Applicant: FUJITSU LIMITED, Kawasaki-shi, Kanagawa (JP)

(72) Inventors: Hiroshi Matsumura, Isehara (JP); Daijiro Ishibashi, Yokohama (JP); Toshihide Suzuki, Zama (JP); Yoichi Kawano, Setagaya (JP)

(73) Assignee: FUJITSU LIMITED, Kawasaki (JP)

( * ) Notice: Subject to any disclaimer, the term of this patent is extended or adjusted under 35 U.S.C. 154(b) by 41 days.

(21) Appl. No.: 14/740,507

(22) Filed: Jun. 16, 2015

(65) Prior Publication Data
US 2016/0006131 A1    Jan. 7, 2016

(30) Foreign Application Priority Data
Jul. 4, 2014 (JP) .................................. 2014-138239

(51) Int. Cl.
*H01Q 19/10* (2006.01)
*H01L 21/56* (2006.01)
(Continued)

(52) U.S. Cl.
CPC .............. *H01Q 19/10* (2013.01); *H01L 21/56* (2013.01); *H01L 23/293* (2013.01);
(Continued)

(58) Field of Classification Search
CPC ...... H01Q 19/10; H01Q 7/00; H01Q 1/2283; H01L 21/56; H01L 23/3107; H01L 23/293; H01L 2223/6677; H01L 2224/18; H01L 24/96; H01L 23/66

USPC .......................................................... 343/843
See application file for complete search history.

(56) References Cited

U.S. PATENT DOCUMENTS 8,901,719 B2 *  12/2014  Ligander ........... H01L 23/49503
                                                      257/664
2003/0042993 A1 *  3/2003  Sayanagi ................ H01L 23/66
                                                      333/26
(Continued)

FOREIGN PATENT DOCUMENTS

JP      S63-95306 U      6/1988
JP      2002-76237 A1    3/2002
JP      2002-314323 A1   10/2002
(Continued)

OTHER PUBLICATIONS

M. Henawy, et al.; "Integrated Antennas in eWLB Packages for 77 GHz and 79 GHz Automotive Radar Sensors;" Proceedings of the 8th European Radar Conference; Oct. 12-14, 2011; United Kingdom; pp. 424-427 (4 Sheets)/p. 2 of specification.

*Primary Examiner* — Jean B Jeanglaude
(74) *Attorney, Agent, or Firm* — Kratz, Quintos & Hanson, LLP

(57) ABSTRACT

A high-frequency module includes an integrated body including a semiconductor chip and a reflector, the semiconductor and the reflector being integrated by a resin; an antenna provided with a space from the reflector; and a rewiring layer provided on the surface of the integrated body, the rewiring layer including a rewiring line electrically coupling the semiconductor chip to the antenna. Further, a method for manufacturing a high-frequency module, the method includes forming an integrated body by integrating a semiconductor chip with a reflector by a resin; and forming a rewiring layer on the surface of the integrated body, the rewiring layer including a rewiring line electrically coupling the semiconductor chip to an antenna provided with a space from the reflector.

20 Claims, 18 Drawing Sheets

(51) Int. Cl.
*H01L 23/31* (2006.01)
*H01L 23/29* (2006.01)
*H01L 23/66* (2006.01)
*H01L 23/00* (2006.01)
*H01Q 1/22* (2006.01)
*H01Q 7/00* (2006.01)

(52) U.S. Cl.
CPC .......... *H01L 23/3107* (2013.01); *H01L 23/66* (2013.01); *H01L 24/96* (2013.01); *H01Q 1/2283* (2013.01); *H01L 2223/6677* (2013.01); *H01L 2224/18* (2013.01); *H01Q 7/00* (2013.01)

(56) References Cited

U.S. PATENT DOCUMENTS

| | | |
|---|---|---|
| 2006/0038723 A1 | 2/2006 | Watanabe |
| 2012/0050125 A1* | 3/2012 | Leiba .................. H01Q 1/2283 343/834 |
| 2015/0048471 A1* | 2/2015 | Hasch .................... H01L 23/66 257/433 |
| 2015/0262842 A1* | 9/2015 | Iijima .................... H01L 21/52 257/664 |

FOREIGN PATENT DOCUMENTS

| | | |
|---|---|---|
| JP | 2005-167966 A1 | 6/2005 |
| JP | 2007-235199 A1 | 9/2007 |

* cited by examiner

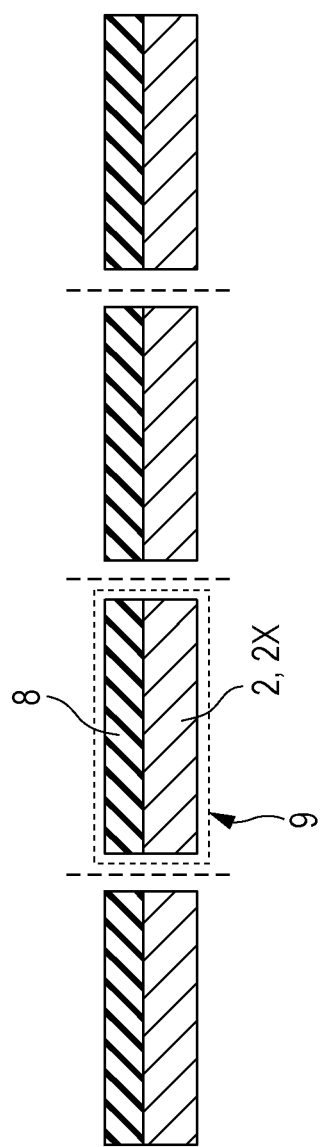

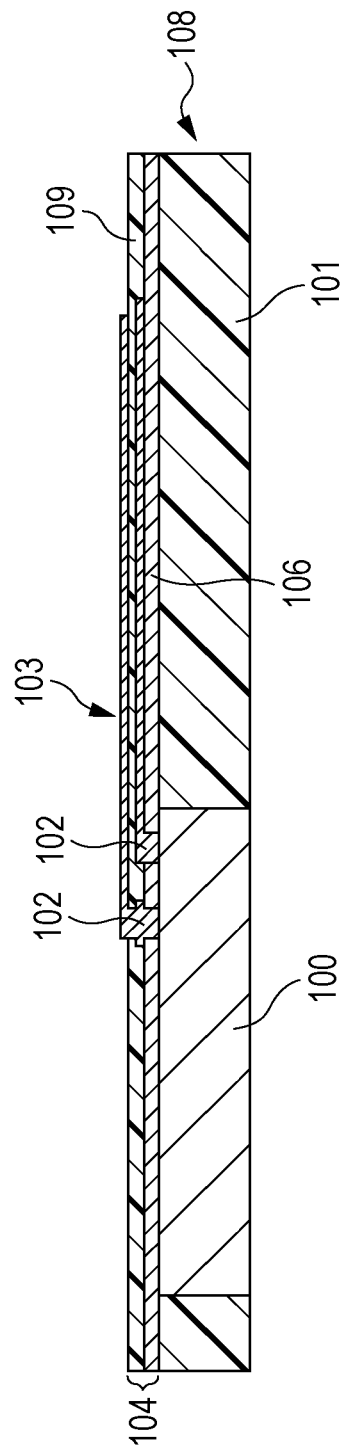

HIGH-FREQUENCY MODULE AND METHOD FOR MANUFACTURING THE SAME

CROSS-REFERENCE TO RELATED APPLICATION

This application is based upon and claims the benefit of priority of the prior Japanese Patent Application No. 2014-138239, filed on Jul. 4, 2014, the entire contents of which are incorporated herein by reference.

FIELD

The embodiments discussed herein are related to a high-frequency module and a method for manufacturing the same.

BACKGROUND

In a high-frequency module having a semiconductor chip and an antenna mounted on a substrate, for example, influences of loss and reflection due to impedance mismatch in a solder joint part and loss in a transmission line are increased in an attempt to transmit a high-frequency signal such as millimeter waves and terahertz waves, for example.

This is because, since the wavelength is reduced in a high-frequency region such as millimeter waves and terahertz waves, for example, the influences of the loss and reflection in the solder joint part and the loss in the transmission line on the transmitted signals are increased even for the solder joint part or a short transmission line.

As a result, signal quality between the semiconductor chip and the antenna is reduced, leading to reduction in performance of the high-frequency module. Also, the influence on high-frequency characteristics is also increased by variations during mounting. Therefore, it is conceivable to use a heterogeneous device integration technology such as Fan-Out Wafer Level Packaging (FO-WLP) and a pseudo System onChip (SoC) technology, for example, to realize high manufacturing stability by connecting the semiconductor chip and the antenna with low loss by a wide short transmission line and thus reducing the module in size, without using the solder joint part to connect the semiconductor chip and the antenna.

Note that the heterogeneous device integration technology is a technology to manufacture a module having heterogeneous devices integrated therein by disposing devices (elements) close to each other, sealing the devices with a resin to form a pseudo-wafer, connecting the devices to each other through rewiring lines using a rewiring technology and dicing the wafer into pieces having a chip size. This technology may reduce the size of the module since the devices may be disposed close to each other. Also, the loss may be reduced since the devices may be connected to each other at a short distance. Moreover, the devices may be connected to each other without using solder joint. The devices may be connected to each other with low loss since the transmission line (signal line) may be increased in width compared with a semiconductor process. Furthermore, high manufacturing stability may be realized while reducing manufacturing variations.

Related techniques are disclosed in, for example, Japanese Laid-open Patent Publication Nos. 2007-235199, 2005-167966, 2002-314323, and 2002-76237, and Japanese Unexamined Utility Model Registration Application Publication No. 63-95306.

Related techniques are also disclosed in, for example, Mahmoud Al Henawy et al., "Integrated Antennas in eWLB Packages for 77 GHz and 79 GHz Automotive Radar Sensors", Proceedings of the 8th European Radar Conference, 12-14 Oct. 2011, UK.

SUMMARY

According to an aspect of the invention, a high-frequency module includes an integrated body including a semiconductor chip and a reflector, the semiconductor and the reflector being integrated by a resin; an antenna provided with a space from the reflector; and a rewiring layer provided on the surface of the integrated body, the rewiring layer including a rewiring line electrically coupling the semiconductor chip to the antenna.

According another aspect of the invention, a method for manufacturing a high-frequency module, the method includes forming an integrated body by integrating a semiconductor chip with a reflector by a resin; and forming a rewiring layer on the surface of the integrated body, the rewiring layer including a rewiring line electrically coupling the semiconductor chip to an antenna provided with a space from the reflector.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 3A and 3B are schematic cross-sectional views illustrating a method for manufacturing a reflector block included in the high-frequency module according to the first embodiment;

FIG. 20 is a schematic cross-sectional view illustrating a problem of a high-frequency module including an antenna and a reflector.

DESCRIPTION OF EMBODIMENTS

Figure 19:
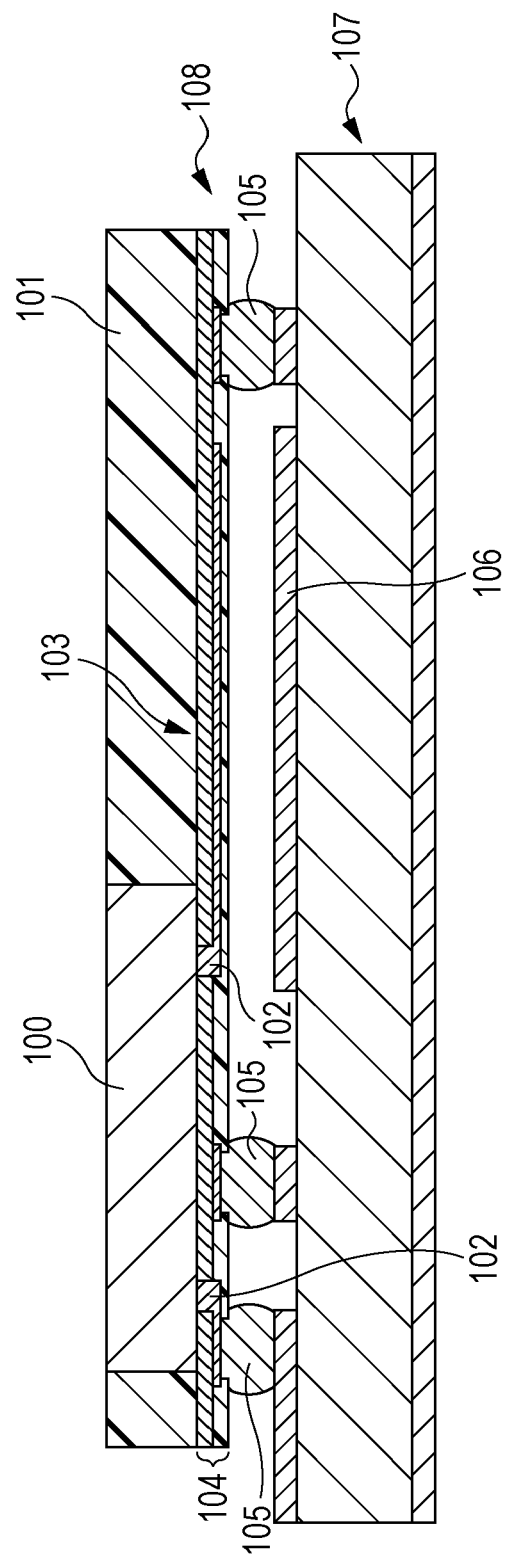
FIG. 19 is a schematic cross-sectional view illustrating a problem of a high-frequency module including an antenna and a reflector.

Incidentally, as illustrated in FIG. 19, for example, the heterogeneous device integration technology is used to integrally form a semiconductor chip 100 (for example, an MMIC: monolithic microwave integrated circuit), a rewiring line 102 to transmit a high-frequency signal and an antenna 103 by sealing the semiconductor chip 100 with a resin 101 and providing a rewiring layer 104 including the rewiring line 102 and the antenna 103. Then, a solder 105 is provided on the rewiring layer 104 side, and the integrated body thus obtained is mounted on a substrate 107, for example, a printed circuit board (PCB), having a reflector 106 provided thereon, thereby obtaining a high-frequency module 108. Note that the antenna is also called a high-frequency antenna, a millimeter-wave antenna or a terahertz-wave antenna. The high-frequency module is also called an antenna module or a high-frequency antenna module.

However, in the high-frequency module as illustrated in FIG. 19, the integrated body obtained by integrally forming the semiconductor chip 100, the rewiring line 102, and the antenna 103 is solder-joined to the substrate 107 having the reflector 106 provided thereon. Thus, the distance between the antenna 103 and the reflector 106 depends on the height of the solder 105 (for example, the size of the solder ball 105). Since it is difficult to freely select the height of the solder 105, a degree of freedom of design for the distance between the antenna 103 and the reflector 106 is low. Moreover, it is difficult to improve antenna efficiency (radiation efficiency). Furthermore, a degree of freedom of design for the substrate 107 is also reduced. When an underfill material is provided to secure the physical strength in the case of a minute solder 105, electrical characteristics (high-frequency characteristics) may be deteriorated.

Meanwhile, it is also conceivable to obtain a high-frequency module 108, using the heterogeneous device integration technology, by sealing a semiconductor chip 100 with a resin 101, providing a rewiring layer 104 including a rewiring line 102 to transmit a high-frequency signal, an antenna 103 and a reflector 106, and thus integrally forming the semiconductor chip 100, the rewiring line 102, the antenna 103, and the reflector 106, as illustrated in FIG. 20, for example.

However, it is difficult to freely select the thickness and material of a resin layer (dielectric layer; insulating layer) 109 included in the rewiring layer 104. Thus, a degree of freedom of design for the distance between the antenna 103 and the reflector 106 is low. Moreover, it is difficult to improve antenna efficiency. Therefore, it is wished to increase the degree of freedom of design for the distance between the antenna and the reflector, and to improve the antenna efficiency.

Hereinafter, with reference to the drawings, description is given of a high-frequency module and a method for manufacturing the same according to embodiments.

First Embodiment

First, with reference to FIGS. 1A to 11B, description is given of a high-frequency module and a method for manufacturing the same according to a first embodiment.

The high-frequency module according to this embodiment is a high-frequency module mounted in radio equipment such as a radio transceiver, a radar device, and a communication device, used in a high-frequency region such as millimeter waves and terahertz waves, for example.

Figure 1A:
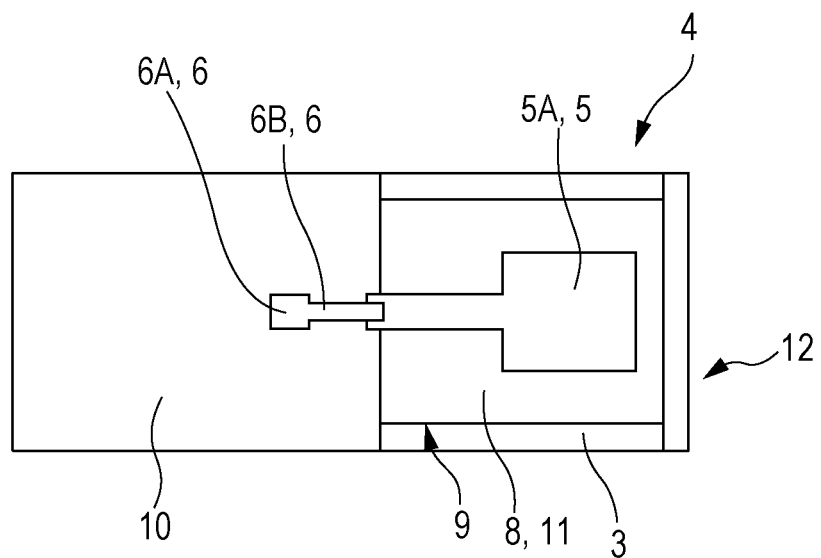
FIG. 1A is a plan view schematically illustrating a configuration of a high-frequency module according to a first embodiment.
Figure 1B:
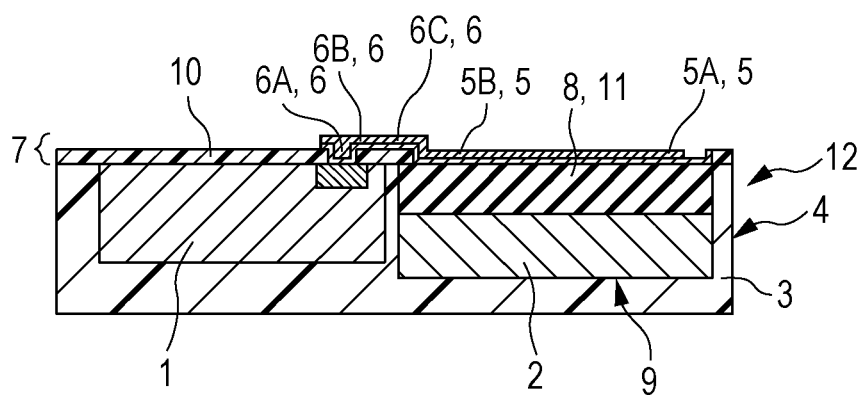
FIG. 1B is a cross-sectional view schematically illustrating a configuration of a high-frequency module according to the first embodiment.

As illustrated in FIGS. 1A and 1B, the high-frequency module according to this embodiment includes: an integrated body 4 including a semiconductor chip 1 and a reflector 2 integrated by a resin 3; an antenna 5 provided with a space from the reflector 2; and a rewiring layer 7 provided on the integrated body 4 and configured to include a rewiring line 6 electrically connecting the semiconductor chip 1 to the antenna 5.

Here, in the integrated body 4, the semiconductor chip 1 and the reflector 2 are sealed (resin-sealed) and integrated close to each other in the resin 3. The semiconductor chip 1 is an MMIC chip, for example. The reflector 2 may be a conductor plate, a conductor film or a conductor layer, which is made of a conductor (metal conductor or low-resistance Si conductor) such as metal (metal material), for example Cu, or as low-resistance Si. The resin 3 is a mold resin.

Note that the antenna 5 is also referred to as a radiation element or an antenna radiation element. The reflector 2 is also referred to as a reflector element or an antenna reflector element. In this case, one including the antenna 5 and the reflector 2, in other words, the radiation element and the reflector element is also referred to as an antenna module.

In this embodiment, the integrated body 4 includes a dielectric layer 8 (insulating layer) which comes into contact with the antenna 5 side of the reflector 2 and has its surface exposed on the surface of the integrated body 4. Here, in the integrated body 4, the semiconductor chip 1 and a reflector block 9 are resin-sealed and integrated close to each other by the resin 3, the reflector block 9 including a block structure in which the reflector 2 and the dielectric layer 8 are integrated with each other. Here, the dielectric layer 8 (insulating layer) is a layer made of a dielectric material (insulating material), and may be formed of a dielectric plate (insulating plate), a dielectric film (insulating film) or a dielectric layer (insulating layer). For example, the reflector block 9 may be formed by laminating (loading) the dielectric layer 8 on the conductor serving as the reflector 2.

The rewiring layer 7 is provided on the surface of the integrated body 4 thus configured, using a rewiring technology used for a pseudo-SoC technology, for example. More specifically, using a heterogeneous device integration technology and the rewiring technology, the rewiring layer 7 including the rewiring line 6 and the antenna 5 is provided on or over the semiconductor chip 1 and the reflector 2 which are resin-sealed so that the antenna 5 is coupled to the semiconductor chip 1 through the rewiring line 6. Thus, since no solder joint is used to connect the semiconductor chip 1 and the antenna 5 to each other, waveform degradation due to signal reflection may be suppressed even when transmitting a high-frequency signal of a superhigh frequency such as millimeter waves and terahertz waves, for example. Moreover, the semiconductor chip 1 and the antenna 5 may be connected with low loss by a wide short transmission line (rewiring line). Furthermore, the module may be reduced in size and high manufacturing stability may be realized while reducing manufacturing variations.

In this embodiment, the rewiring line 6 includes a line conductor 6B electrically connected to the semiconductor chip 1 through a via 6A provided in a resin layer (dielectric layer; insulating layer) 10 formed on the resin 3 included in the integrated body 4. Note that, here, the rewiring line 6 includes a seed layer 6C provided below the line conductor 6B. The antenna 5 includes an antenna conductor 5A connected to the line conductor 6B serving as the rewiring line 6. Here, the line conductor 6B as the rewiring line 6 is electrically connected to the semiconductor chip 1 through the via 6A, and is also electrically connected to the antenna conductor 5A as the antenna 5. Note that, here, the antenna 5 includes a seed layer 5B provided below the antenna conductor 5A. The resin layer 10 is a photosensitive resin layer (for example, a photosensitive phenolic resin layer). The line conductor 6B and the antenna conductor 5A are made of metal such as copper, for example.

The rewiring line 6 and the antenna 5 having such configurations may be formed by plating using a semi-additive method, for example, or may be formed of metal paste (for example, copper paste or silver paste) using an ink-jet method. However, formation by plating using the semi-additive method is preferable considering costs and mounting accuracy.

Particularly, in this embodiment, the antenna 5, in other words, the antenna conductor 5A is provided on the surface of the dielectric layer 8 included in the reflector block 9 included in the integrated body 4. More specifically, the antenna 5 and the reflector 2 are provided on both upper and lower sides of the dielectric layer 8. The reflector 2 comes into contact with the lower surface of the dielectric layer 8, and the antenna 5 comes into contact with the upper surface of the dielectric layer 8. As described above, the reflector 2 is provided below the antenna 5 with a space corresponding to the thickness of the dielectric layer 8 while sandwiching the dielectric layer 8 therebetween. In other words, the antenna 5 is provided above the reflector 2 with a space corresponding to the thickness of the dielectric layer 8 while sandwiching the dielectric layer 8 therebetween.

Note that, here, the antenna 5 is provided directly on the surface of the dielectric layer 8 included in the reflector block 9 included in the integrated body 4. However, this embodiment is not limited thereto, but the antenna 5 may be provided above the dielectric layer 8 included in the reflector block 9 included in the integrated body 4, while sandwiching the resin layer 10 included in the rewiring layer 7 therebetween. Note, however, that the influence of the material used for the resin layer 10 included in the rewiring layer 7 on high-frequency characteristics may be suppressed by providing the antenna 5 directly on the surface of the dielectric layer 8 included in the reflector block 9 included in the integrated body 4 as described above, rather than sandwiching the resin layer 10 included in the rewiring layer 7.

By adopting such a configuration and adjusting the thickness of the dielectric layer 8 included in the reflector block 9 included in the integrated body 4, a distance between the reflector 2 and the antenna 5 may be adjusted. Thus, the dielectric layer 8 is provided to adjust the distance between the reflector 2 and the antenna 5. Therefore, the dielectric layer 8 is also called a distance adjuster 11. More specifically, in this embodiment, the integrated body 4 includes the distance adjuster 11 configured to adjust the distance between the reflector 2 and the antenna 5. The distance adjuster 11 is the dielectric layer 8 provided on the antenna 5 side of the reflector 2.

Moreover, for the dielectric material to form the dielectric layer 8 included in the reflector block 9 included in the integrated body 4, in other words, the dielectric layer 8 sandwiched between the reflector 2 and the antenna 5, a material different from that used for the resin layer 10 included in the rewiring layer 7. Particularly, a material having good high-frequency characteristics, in other words, a material (low-loss material) having low loss in a high-frequency region may be used.

Here, as opposed to photosensitive phenolic resin (a relative permittivity of about 3.5 and a dielectric tangent of about 0.02) used for the resin layer 10 included in the rewiring layer 7, examples of the material having good high-frequency characteristics include: polyphenylene ether resin (a relative permittivity of about 2.5 and a dielectric tangent of about 0.002) that is a material having a low permittivity (relative permittivity) and a low dielectric tangent; thermosetting epoxy resin (a relative permittivity of about 3.66 and a dielectric tangent of about 0.009; used for mold resin, for example) containing a quartz filler, which is a material having a low dielectric tangent; epoxy resin (an epoxy film material; a relative permittivity of about 3.2 and a dielectric tangent of about 0.019) containing a quartz filler, which is a material having a low permittivity (relative permittivity); and the like. Besides the above, examples of the material having good high-frequency characteristics, in other words, a low-permittivity material or the low-loss material include benzocyclobutene, liquid crystal polymer, cycloolefin polymer, fluorine resin typified by polyolefin, polystyrene and polytetrafluoroethylene, and the like.

Note that, with the configuration as described above, the thickness of the dielectric layer 8 included in the reflector block 9 included in the integrated body 4 may be increased, and thus the distance between the antenna 5 and the reflector 2 may be increased. Therefore, antenna efficiency may also be improved by using the photosensitive phenolic resin used for the resin layer 10 included in the rewiring layer 7 or phenolic resin for the dielectric layer 8 and increasing the thickness thereof.

Here, the reflector block 9 including the reflector 2 and the dielectric layer 8 integrated with each other, in other words, the reflector block 9 in which the reflector 2 and the dielectric layer 8 are formed into a block shape is used and may be disposed adjacent to the semiconductor chip 1. Thus, the dielectric material having good high-frequency characteristics may be applied to the heterogeneous device integration technology.

Such a configuration may increase a degree of freedom of design for the distance between the antenna 5 and the reflector 2, and thus improve the antenna efficiency (radiation efficiency). Thus, in a high-frequency module 12 with the antenna 5 mounted thereon, a high-performance antenna may be realized when the heterogeneous device integration technology and rewiring technology are applied, which realizes reduction in size and reduces manufacturing variations.

More specifically, when an antenna and a reflector are provided in a rewiring layer, for example (see FIG. 20), a via or the like is preferably provided, and workability is desirably considered. Therefore, it is difficult to freely select the thickness or material of a resin layer (dielectric layer) included in the rewiring layer. For this reason, the degree of freedom of design for the distance between the antenna and the reflector is low, and it is difficult to improve the antenna efficiency.

On the other hand, the configuration as described above expands the range of choices for the material of the dielectric layer 8 sandwiched between the reflector 2 and the antenna 5, and also expands the adjustable range for the thickness of the dielectric layer 8. Thus, the degree of freedom of design for the distance between the antenna 5 and the reflector 2 may be increased, and the antenna efficiency may be improved. For example, the thickness of the dielectric layer 8 included in the reflector block 9 included in the integrated body 4 enables the distance between the antenna 5 and the reflector 2 to be set so as to improve the antenna efficiency for the wavelength of a high-frequency signal to be transmitted.

Figure 2A:
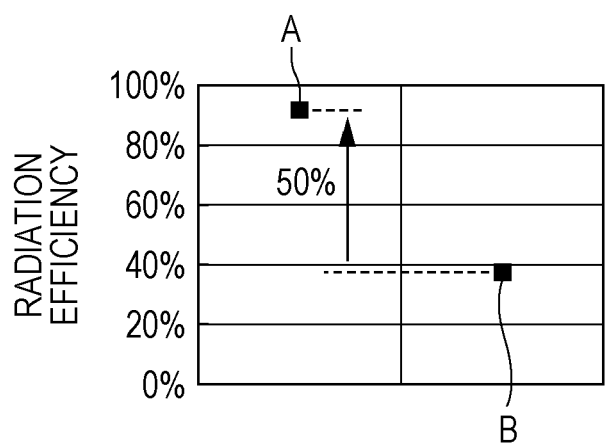
FIG. 2A is a diagram illustrating a radiation efficiency obtained by electromagnetic field analysis for high-frequency modules according to the first embodiment and a comparative example.
Figure 2B:
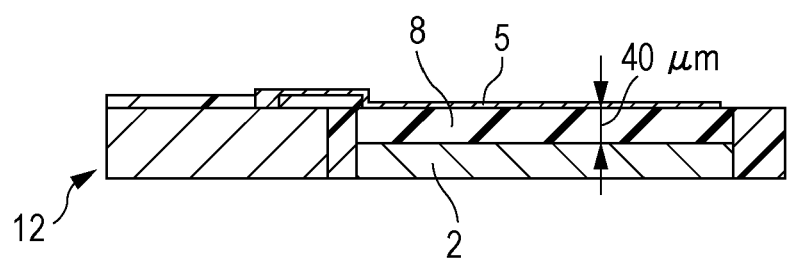
FIG. 2B is a schematic cross-sectional view illustrating the configuration of the high-frequency module according to the first embodiment as a target for the electromagnetic field analysis.
Figure 2C:
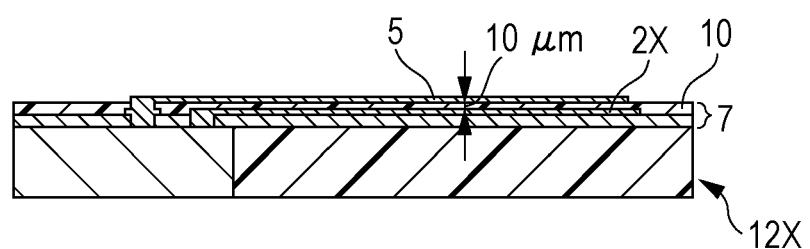
FIG. 2C is a schematic cross-sectional view illustrating a configuration of the high-frequency module according to the comparative example as a target for the electromagnetic field analysis.

Here, FIG. 2A illustrates radiation efficiency (antenna efficiency) obtained by electromagnetic field analysis for the high-frequency module 12 [see FIG. 2B] according to this embodiment thus configured as well as radiation efficiency obtained by electromagnetic field analysis for a high-frequency module 12X [see FIG. 2C] according to a comparative example in which an antenna and a reflector are provided in a rewiring layer.

Note that, here, in the high-frequency module 12 according to this embodiment, a polyphenylene ether resin (PPE film material) having a relative permittivity of about 2.5 and a dielectric tangent of about 0.002 is used for the dielectric layer 8 provided between the antenna 5 and the reflector 2, and the thickness thereof is set to about 40 µm, as illustrated in FIG. 2B. On the other hand, in the high-frequency module 12X according to the comparative example, a photosensitive phenolic resin having a relative permittivity of about 3.5 and a dielectric tangent of about 0.02 is used for a resin layer 10 provided between an antenna 5 and a reflector 2X included in a rewiring layer 7, and the thickness thereof is set to about 10 µm, as illustrated in FIG. 2C. Moreover, here, FIG. 2A illustrates the radiation efficiency in a terahertz waveband of a frequency 300 GHz (300 GHz band), to be more specific, radiation efficiency obtained by electromagnetic field analysis for a single patch antenna that resonates in the 300 GHz band.

The radiation efficiency of the high-frequency module 12 according to this embodiment (see reference symbol A in FIG. 2A) is about 94%, while the radiation efficiency of the high-frequency module 12X according to the comparative example (see reference symbol B in FIG. 2A) is about 40%. Therefore, the radiation efficiency of the high-frequency module 12 according to this embodiment is improved about 50% as high as the radiation efficiency of the high-frequency module 12X according to the comparative example, as illustrated in FIG. 2A.

Moreover, as the thickness of the dielectric layer 8, in other words, the distance between the antenna 5 and the reflector 2 is increased in the high-frequency module 12 under the operating condition of 300 GHz according to this embodiment, the radiation efficiency reaches about 98% when the thickness of the dielectric layer 8, in other words, the distance between the antenna 5 and the reflector 2 is about 60 µm, which is the maximum radiation efficiency. Note that, when the thickness is larger than 60 µm, impedance matching may not be achieved at 300 GHz, and thus operating conditions may not be met.

As described above, when the polyphenylene ether resin having a relative permittivity of about 2.5 and a dielectric tangent of about 0.002 is used for the dielectric layer 8 provided between the antenna 5 and the reflector 2 in the high-frequency module 12 according to this embodiment, it is preferable, according to the radiation efficiency obtained by the electromagnetic field analysis described above, that the thickness of the dielectric layer 8, in other words, the distance between the antenna 5 and the reflector 2 is set to about 40 µm to 60 µm in the 300 GHz band, in other words, terahertz waveband. This is because sufficiently high radiation efficiency may not be achieved when the thickness is less than about 40 µm, and the impedance matching may not be achieved when the thickness is larger than about 60 µm.

Moreover, when the same electromagnetic field analysis is conducted for the high-frequency module 12 according to this embodiment, in which the thermosetting epoxy resin (a relative permittivity of about 3.66 and a dielectric tangent of about 0.009) containing a quartz filler is used for the dielectric layer 8 provided between the antenna 5 and the reflector 2, and as the thickness of the dielectric layer 8, in other words, the distance between the antenna 5 and the reflector 2 is increased under the operating condition of 300 GHz, the radiation efficiency reaches about 96% when the thickness of the dielectric layer 8, in other words, the distance between the antenna 5 and the reflector 2 is about 70 µm, which is the maximum radiation efficiency. Note that, when the thickness is larger than 70 µm, impedance matching may not be achieved at 300 GHz, and thus the operating conditions may not be met.

Furthermore, when the same electromagnetic field analysis is conducted for the high-frequency module 12 according to this embodiment, in which the epoxy resin (epoxy film material; a relative permittivity of about 3.2 and a dielectric tangent of about 0.019) containing a quartz filler is used for the dielectric layer 8 provided between the antenna 5 and the reflector 2, and as the thickness of the dielectric layer 8, in other words, the distance between the antenna 5 and the reflector 2 is increased under the operating condition of 300 GHz, the radiation efficiency reaches about 92% when the thickness of the dielectric layer 8, in other words, the distance between the antenna 5 and the reflector 2 is about 60 µm, which is the maximum radiation efficiency. Note that, when the thickness is larger than 60 µm, impedance matching may not be achieved at 300 GHz, and thus the operating conditions may not be met.

As described above, it is preferable, according to the radiation efficiency obtained by the electromagnetic field analyses described above, that the thickness of the dielectric layer 8, in other words, the distance between the antenna 5 and the reflector 2 is set to about 40 µm to 70 µm in the 300 GHz band, in other words, terahertz waveband. This is because sufficiently high radiation efficiency may not be achieved when the thickness is less than about 40 µm, and the impedance matching may not be achieved when the thickness is larger than about 70 µm.

Next, description is given of a method for manufacturing a high-frequency module according to this embodiment.

First, an integrated body 4 is formed by integrating a semiconductor chip 1 with a reflector 2 using a resin 3 (a step of forming an integrated body).

Next, a rewiring layer 7 is formed on the surface of the integrated body 4, the rewiring layer 7 including a rewiring line 6 electrically connecting the semiconductor chip 1 to an antenna 5 provided with a space from the reflector 2 (a step of forming a rewiring layer).

In this embodiment, a dielectric layer 8 is provided on the reflector 2 before the step of forming the integrated body 4 (a step of providing the dielectric layer 8 on the reflector 2).

Then, in the step of forming the integrated body 4, the semiconductor chip 1 and the reflector 2 having the dielectric layer 8 provided thereon are integrated with each other by the resin 3 to form the integrated body 4. More specifically, in the step of forming the integrated body 4, the semiconductor chip 1, the reflector 2 and a distance adjuster 11 (here, the dielectric layer 8) for adjusting a distance between the reflector 2 and the antenna 5 are integrated with each other by the resin 3 to form the integrated body 4.

Next, in the step of forming the rewiring layer 7, the rewiring layer 7 including the rewiring line 6 and the antenna 5 is formed on the surface of the integrated body 4 on the side where the dielectric layer 8 is exposed. More specifically, in the step of forming the rewiring layer 7, the rewiring layer 7 including the rewiring line 6 and the antenna 5 is formed on the surface of the integrated body 4 on the side where the distance adjuster 11 (here, the dielectric layer 8) is exposed.

It is preferable that the antenna 5 is formed on the surface of the dielectric layer 8 in the step of forming the rewiring layer 7.

The method is described more specifically below with reference to FIGS. 3A to 6C.

Note that, here, description is given taking as an example the case where the high-frequency module 12 is manufactured by FO-WLP.

First, a reflector block 9 including the reflector 2 and the dielectric layer 8 integrated with each other, in other words, the reflector block 9 to be resin-sealed with the semiconductor chip 1 is prepared (the step of providing the dielectric layer 8 on the reflector 2).

For example, as illustrated in FIG. 3A, the dielectric layer 8 made of polyphenylene ether resin or the like, for example, is loaded on a metal conductor 2X made of copper or the like, for example. Then, as illustrated in FIG. 3B, the resultant structure having the dielectric layer 8 loaded on the reflector 2 made of the metal conductor 2X is diced into pieces of the desired size by using a diamond blade, for example, thereby preparing the reflector block 9 having the reflector 2 and the dielectric layer 8 integrated with each other.

Figure 4A:
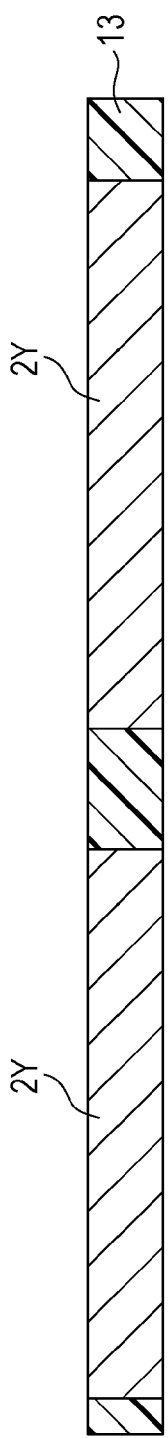
FIGS. 4A to 4C are schematic cross-sectional views illustrating a modified example of the method for manufacturing the reflector block included in the high-frequency module according to the first embodiment.
Figure 4B:
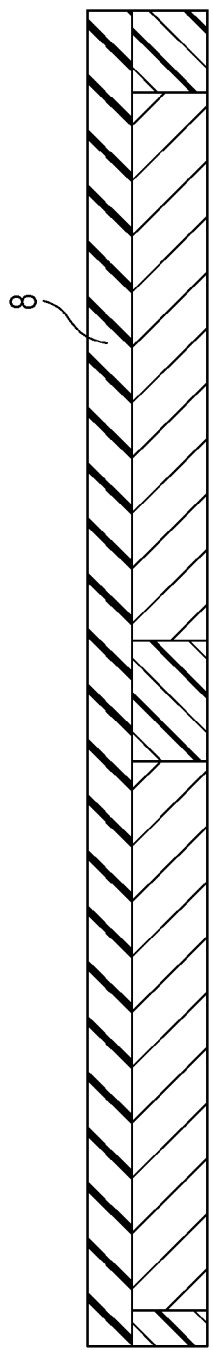
Figure 4C:
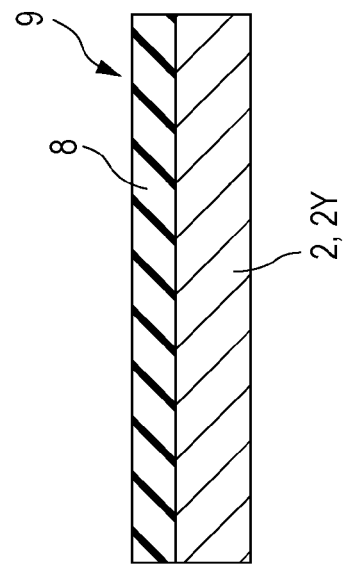

Alternatively, as illustrated in FIG. 4A, for example, a structure (pseudo-wafer) obtained by integrating a metal conductor (metal piece) 2Y made of copper or the like, for example, may be formed. Then, a dielectric layer 8 having an arbitrary thickness may be formed thereon as illustrated in FIG. 4B. Thereafter, the resultant structure having the dielectric layer 8 loaded on the reflector 2 made of the metal conductor 2Y may be diced into pieces, thereby preparing the reflector block 9 having the reflector 2 and the dielectric layer 8 integrated with each other, as illustrated in FIG. 4C.

Next, an integrated body 4 is formed by integrating a semiconductor chip 1 (for example, an MMIC) with the reflector block 9 using a resin 3 (a step of forming the integrated body 4).

Figure 5A:
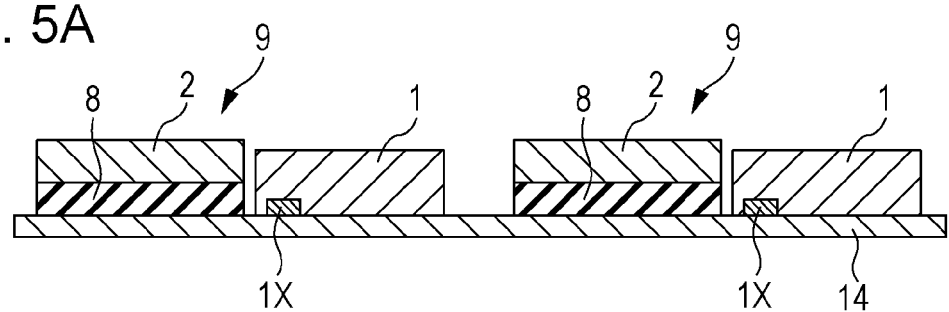
FIGS. 5A to 5E are schematic cross-sectional views illustrating a method for manufacturing a high-frequency module according to the first embodiment.
Figure 5B:
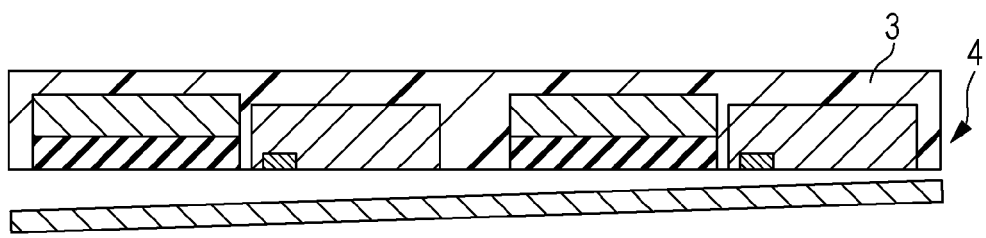

As illustrated in FIG. 5A, for example, the semiconductor chip 1 and the reflector block 9 are disposed on a supporting substrate 14. Then, as illustrated in FIG. 5B, after the integrated body 4 (the pseudo-wafer; including a pseudo-chip) including the semiconductor chip 1 and the reflector block 9 integrated with each other by the mold resin 3 is formed by sealing the semiconductor chip 1 and the reflector block 9 using the mold resin 3, the integrated body 4 is removed from the supporting substrate 14. Note that, in FIG. 5A, reference numeral 1X denotes a terminal of the semiconductor chip 1.

Next, a rewiring layer 7 including an antenna 5 and a rewiring line 6 is formed on the surface of the integrated body 4 (a step of forming the rewiring layer 7).

Here, description is given taking as an example the case where the rewiring layer 7 including the rewiring line 6 and the antenna 5 is formed by plating using a semi-additive method.

Figure 5C:
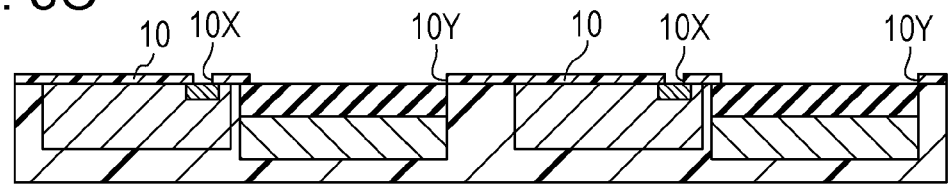

For example, as illustrated in FIG. 5C, a photosensitive resin is applied onto the surface of the integrated body 4 on the side where the dielectric layer 8 included in the reflector block 9 is exposed, and is patterned by exposure, development and curing to form a photosensitive resin layer (dielectric layer; insulating layer) 10 including a via hole 10X on the terminal 1X of the semiconductor chip 1 and an opening 10Y on the dielectric layer 8 included in the reflector block 9. Here, a photosensitive phenolic resin, for example, is used as the photosensitive resin, and may be applied in a thickness of about 10 µm. In this case, tetramethylammonium hydroxide (TMAH), for example, may be used for development. Moreover, curing may be performed at about 200° C. to 250° C. (for example, about 200° C.).

Figure 5D:
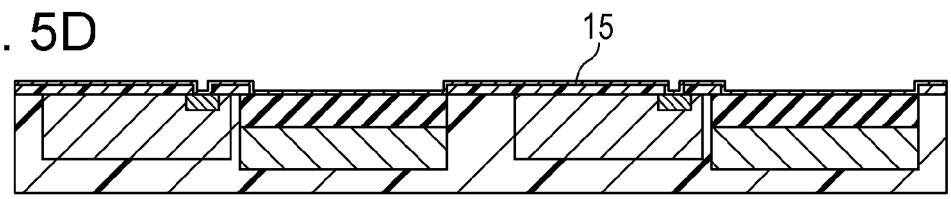

Next, as illustrated in FIG. 5D, a seed layer 15 is formed on the photosensitive resin layer 10. This seed layer 15 may be formed by forming a titanium (Ti) layer in a thickness of about 20 nm by sputtering, for example, and then forming a copper (Cu) layer in a thickness of about 100 nm by sputtering on the titanium (Ti) layer.

Figure 5E:
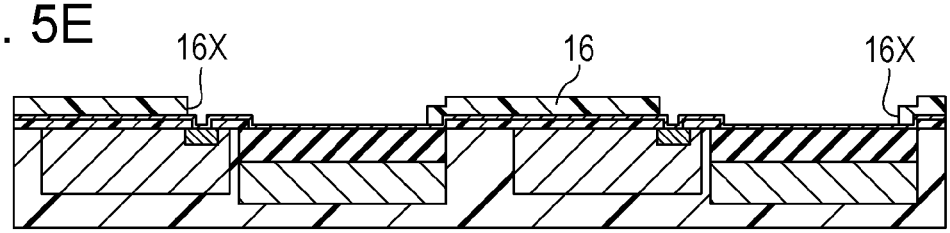

Then, as illustrated in FIG. 5E, a resist pattern 16 is formed on the seed layer 15. This resist pattern 16 may be formed by applying a resist in a thickness of about 8 µm, for example, exposing the resist and developing the resist with tetramethylammonium hydroxide (TMAH), for example. The resist pattern 16 includes an opening 16X in a region where a via 6A (pin) and a line conductor 6B as the rewiring line 6 and an antenna conductor 5A as the antenna 5 are to be formed.

Figure 6A:
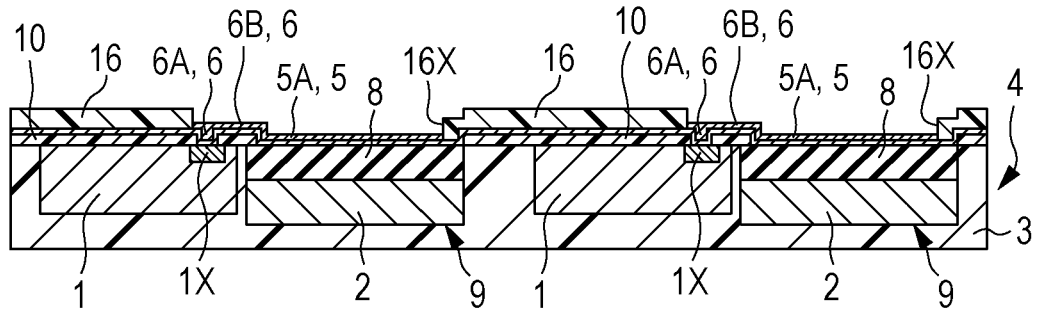
FIGS. 6A to 6C are schematic cross-sectional views illustrating the method for manufacturing a high-frequency module according to the first embodiment.

Next, as illustrated in FIG. 6A, the seed layer 15 is used as a feed layer to deposit (plate) copper (Cu), for example, in a thickness of about 5 µm, for example, as a conductor, in other words, a conductive material by electrolytic plating, for example. Accordingly, the via 6A is formed on the terminal 1X of the semiconductor chip 1, in other words, in the via hole 10X, and the line conductor 6B is formed on the photosensitive resin layer 10 as the rewiring line 6 that is a transmission line electrically connecting the semiconductor chip 1 to the antenna 5. Moreover, on the surface of the dielectric layer 8 included in the reflector block 9, the antenna conductor 5A is formed as the antenna 5 having a shape such as a patch antenna, for example.

Figure 6B:
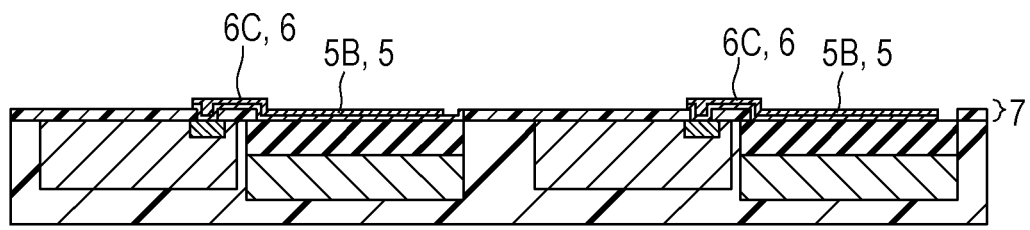

Then, as illustrated in FIG. 6B, after removing the resist pattern 16 with acetone or the like, for example, the seed layer 15 remaining below the removed resist pattern 16 is removed. For example, the copper (Cu) layer included in the seed layer 15 may be removed by wet etching using potassium sulfate, for example, as an etchant, while the titanium (Ti) layer included in the seed layer 15 may be removed by dry etching using mixed gas of carbon tetrafluoride ($CF_4$) and oxygen ($O_2$), for example. Thus, the seed layer 15 remains only below the via 6A, the line conductor 6B and the antenna conductor 5A. The seed layer 15 remaining below the via 6A and the line conductor 6B serves as a seed layer 6C included in the rewiring line 6, while the seed layer 15 remaining below the antenna conductor 5A serves as a seed layer 5B included in the antenna 5.

Thus, the rewiring layer 7 including the rewiring line 6 and the antenna 5 is formed, the rewiring line 6 including the line conductor 6B electrically connected to the semiconductor chip 1 through the via 6A provided in the photosensitive resin layer 10 formed on the mold resin 3, and the antenna 5 including the antenna conductor 5A connected to the line conductor 6B.

Figure 6C:
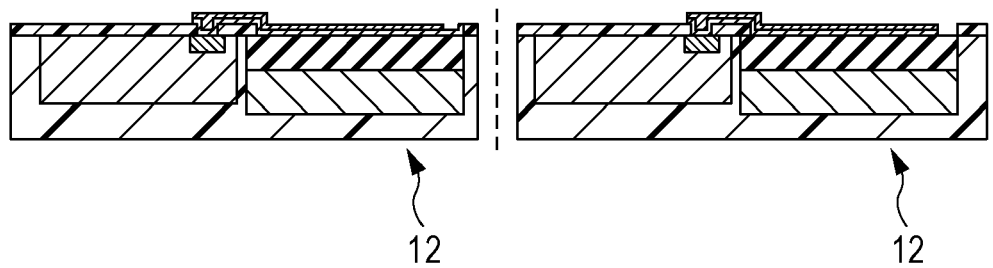

Here, since the steps described above are performed in a wafer state, after the formation of the rewiring layer 7 including the rewiring line 6 and the antenna 5 as described above, the wafer is diced into pieces of the desired chip size using a diamond blade, for example, to obtain a high-frequency module 12, as illustrated in FIG. 6C.

Figure 7:
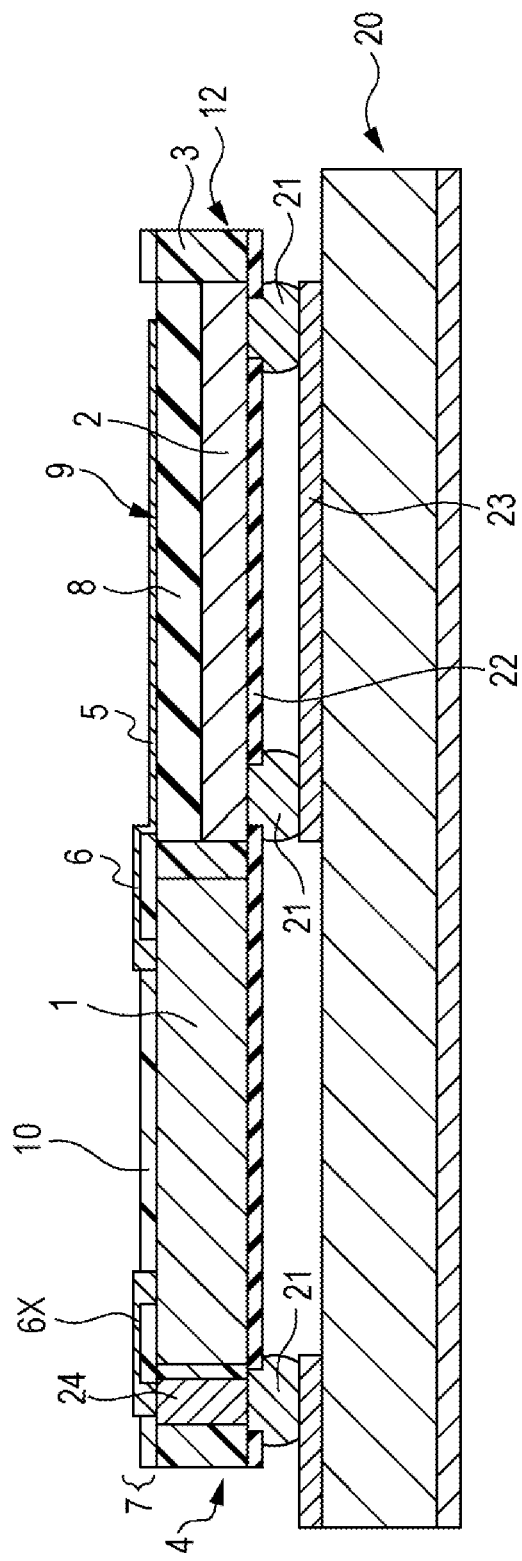
FIG. 7 is a schematic cross-sectional view illustrating an example of a mode of mounting the high-frequency module according to the first embodiment.

Incidentally, the high-frequency module 12 according to the embodiment described above is mounted on a substrate (mounting substrate) 20 such as a PCB, for example, as illustrated in FIG. 7, for example.

Such a mounting mode is substrate mounting by solder joining. Here, the mold resin 3 on the rear surface side of the integrated body 4, in other words, on the side where the reflector 2 is provided is removed, and an insulating film 22 is provided using photosensitive phenolic resin or the like, for example, the insulating film 22 including openings at positions where solders 21 (solder balls) for electrical connection with the substrate 20 are to be provided. Then, the rear surface side of the reflector 2 is soldered to a ground 23 provided on the substrate 20 so as to electrically connect the reflector 2 to the ground 23 provided on the substrate 20, and then the high-frequency module 12 according to the embodiment described above is mounted on the substrate 20.

Note that, here, for the bias or ground, the semiconductor chip 1 is electrically connected to the substrate 20 through a rewiring line 6X provided in the rewiring layer 7, a conductor pin 24 and the solders 21. In this case, the conductor pin 24 may be provided using a through mold via (TMV), for example. More specifically, the conductor pin 24 may be provided by providing the conductor pin 24 near the semiconductor chip 1 before sealing with the mold resin 3 and integrating the conductor pin with the semiconductor chip 1 and the reflector block 9 by the mold resin 3.

Figure 8:
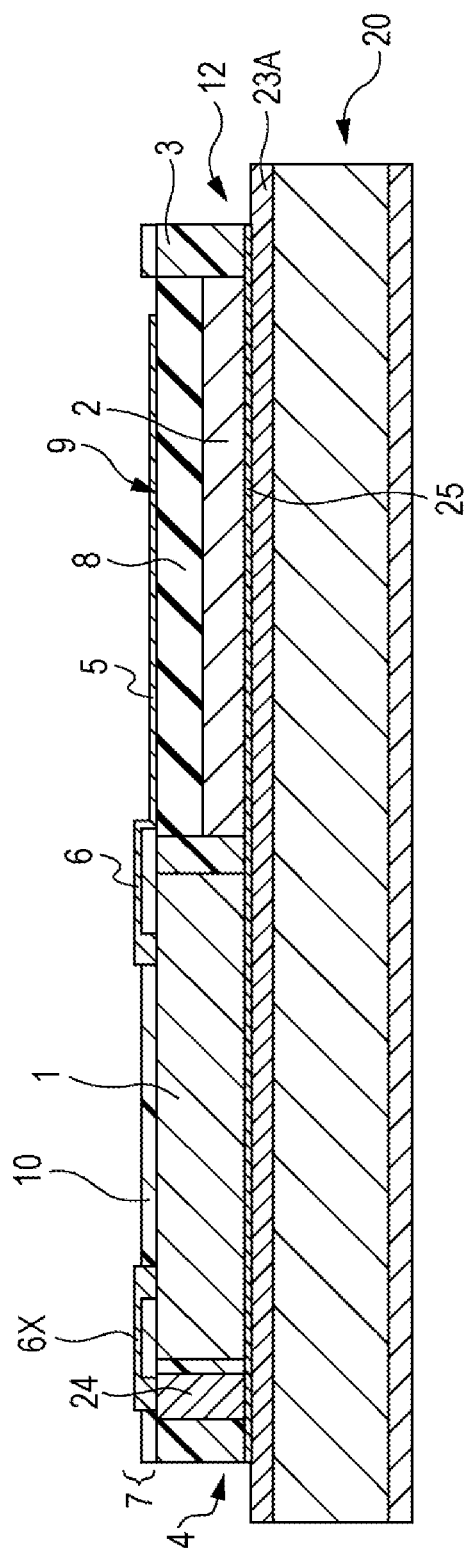
FIG. 8 is a schematic cross-sectional view illustrating another example of a mode of mounting the high-frequency module according to the first embodiment.

Note that the mounting mode is not limited thereto. As illustrated in FIG. 8, for example, the high-frequency module 12 according to the embodiment described above may be mounted on a substrate 20A.

Such a mounting mode is substrate mounting using a conductive adhesive 25. Here, the mold resin 3 on the rear surface side of the integrated body 4, in other words, on the side where the reflector 2 is provided is removed, and the rear surface side of the reflector 2 is attached with the conductive adhesive 25 such as silver paste, for example, to a ground 23A provided on the substrate 20A so as to electrically connect the reflector 2 to the ground 23A provided on the substrate 20A. Then, the high-frequency module 12 according to the embodiment described above is mounted on the substrate 20A.

Note that, here, for the ground, the semiconductor chip 1 is electrically connected to the ground 23A provided on the substrate 20 through a rewiring line 6X provided in the rewiring layer 7, a conductor pin 24 and the conductive adhesive 25. In this case, the conductor pin 24 may be provided using a TMV, for example. More specifically, the conductor pin 24 may be provided by providing the conductor pin 24 near the semiconductor chip 1 before sealing with the mold resin 3 and integrating the conductor pin with the semiconductor chip 1 and the reflector block 9 by the mold resin 3.

Figure 9:
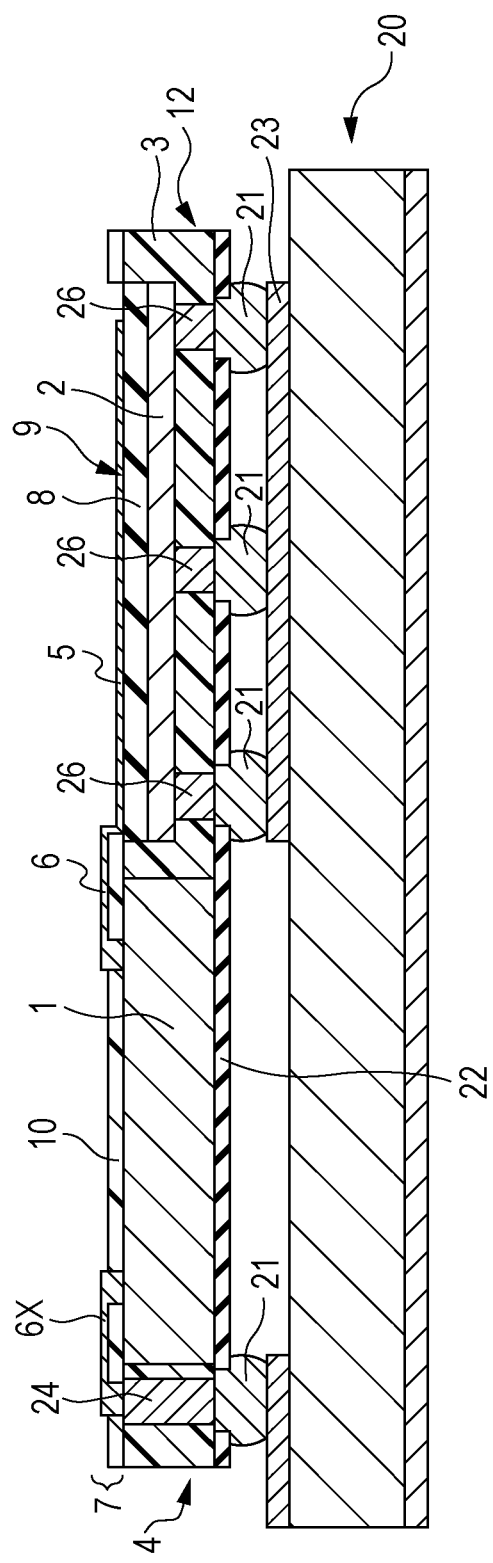
FIG. 9 is a schematic cross-sectional view illustrating another example of a mode of mounting the high-frequency module according to the first embodiment.

Alternatively, the high-frequency module 12 according to the embodiment described above may be mounted on the substrate 20 as illustrated in FIG. 9, for example.

Such a mounting mode is substrate mounting by solder joining for electrically connecting the rear surface side of the reflector 2 (the lower part of the reflector) to the ground 23 provided on the substrate 20 through conductor pins 26. Here, the conductor pins 26 are provided in the mold resin 3 on the rear surface side of the reflector 2, and an insulating film 22 is provided using photosensitive phenolic resin or the like, for example, the insulating film 22 having openings at positions where solders (solder balls) 21 for electrical connection with the substrate 20 are to be provided. Then, the conductor pins 26 provided on the rear surface side of the reflector 2 are soldered to the ground 23 provided on the substrate 20 so as to electrically connect the rear surface side of the reflector 2 to the ground 23 provided on the substrate 20 through the conductor pins 26. Then, the high-frequency module 12 according to the embodiment described above is mounted on the substrate 20.

In this case, the conductor pins 26 may be provided on the rear surface side of the reflector 2 by providing the conductor pins 26 on the rear surface side of the reflector 2 before sealing with the mold resin 3 and integrating the conductor pins with the semiconductor chip 1 and the reflector block 9 by the mold resin 3. Note that the embodiment is not limited thereto, but holes may be formed by laser via processing or the like, for example, after sealing with the mold resin 3, and then the conductor pins 26 may be formed by plating or the like, for example.

Note that, here, for the bias or ground, the semiconductor chip 1 is electrically connected to the substrate 20 through a rewiring line 6X provided in the rewiring layer 7, a conductor pin 24 and solders 21. In this case, the conductor pin 24 may be provided using a TMV, for example. More specifically, the conductor pin 24 may be provided by providing the conductor pin 24 near the semiconductor chip 1 before sealing with the mold resin 3 and integrating the conductor pin with the semiconductor chip 1 and the reflector block 9 by the mold resin 3.

Therefore, the high-frequency module and the manufacturing method thereof according to this embodiment have an advantage of increasing the degree of freedom of design for the distance between the antenna 5 and the reflector 2 and thus improving the antenna efficiency.

Note that, in the high-frequency module 12 according to the embodiment described above, the rewiring layer 7 includes the rewiring line 6 and the antenna 5. Moreover, according to the method for manufacturing the high-frequency module 12, the rewiring layer 7 including the rewiring line 6 and the antenna 5 is formed in the step of forming the rewiring layer 7. The embodiment is not limited thereto.

Figure 11A:
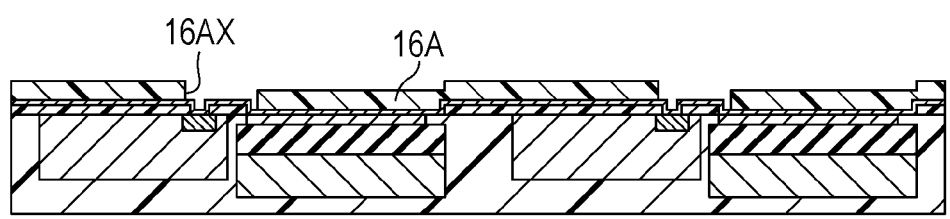
FIGS. 11A and 11B are schematic cross-sectional views illustrating the method for manufacturing a high-frequency module according to the first embodiment when using the reflector block of the modified example illustrated in FIG. 10.
Figure 11B:
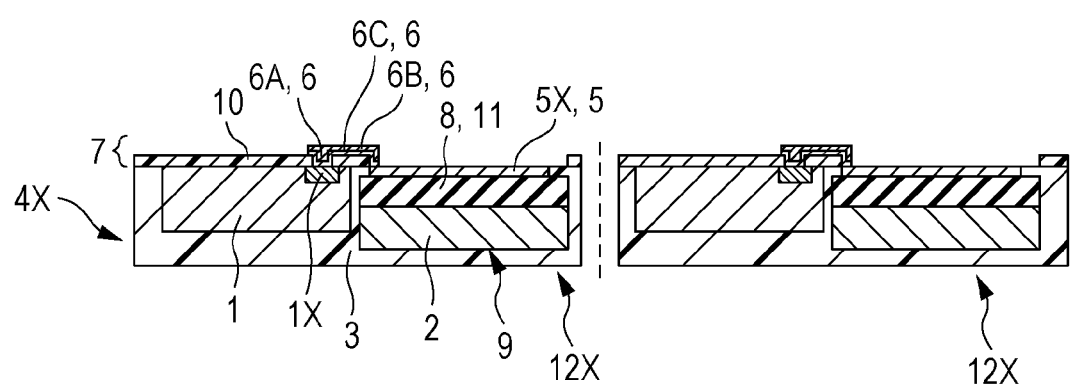

For example, as illustrated in FIG. 11B, in a high-frequency module 12X, an integrated body 4X (in other words, the reflector block 9) may include a dielectric layer 8 (distance adjuster 11) on the antenna 5 side of the reflector 2. In other words, the integrated body 4X may include the dielectric layer 8 which comes into contact with the antenna 5 side of the reflector 2 and has its surface exposed on the surface of the integrated body 4X. Moreover, the antenna (here, the antenna conductor 5X) may be provided on the surface of the dielectric layer 8, and the rewiring layer 7 may include the rewiring line 6 without including the antenna 5.

In this case, the method for manufacturing the high-frequency module 12X includes, before the step of forming the integrated body 4, a step of providing the dielectric layer 8 on the reflector 2 and then providing the antenna 5 on the surface of the dielectric layer 8. In the step of forming the integrated body 4, the semiconductor chip 1 and the reflector 2 having the dielectric layer 8 and the antenna 5 provided thereon are integrated by the resin 3 to form the integrated body 4. Then, in the step of forming the rewiring layer 7, the rewiring layer 7, in other words, the rewiring layer 7 including the rewiring line 6 may be formed on the surface of the side where the antenna 5 in the integrated body 4 is exposed.

In this case, again, the high-frequency module 12X includes: the integrated body 4 having the semiconductor chip 1 and the reflector 2 integrated by the resin 3; the antenna 5 provided with a space from the reflector 2; and the rewiring layer 7 provided on the surface of the integrated body 4, the rewiring layer 7 including the rewiring line 6 electrically connecting the semiconductor chip 1 to the antenna 5. Meanwhile, the method for manufacturing the high-frequency module 12X includes: the step of forming the integrated body 4 by integrating the semiconductor chip 1 with the reflector 2 by the resin 3; and the step of forming the rewiring layer 7 on the surface of the integrated body 4, the rewiring layer 7 including the rewiring line 6 electrically connecting the semiconductor chip 1 to the antenna 5 provided with a space from the reflector 2.

Figure 10:
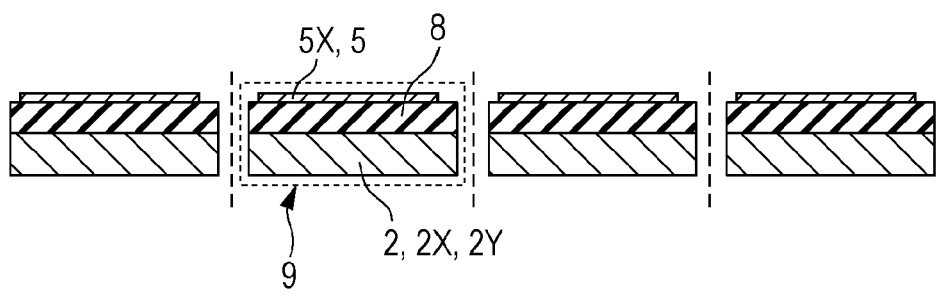
FIG. 10 is a schematic cross-sectional view illustrating a modified example of the reflector block included in the high-frequency module according to the first embodiment.

To be more specific, as illustrated in FIG. 10, for example, the dielectric layer 8 may be loaded on the reflector block 9, in other words, the reflector 2 including conductors 2X and 2Y, according to the embodiment described above. Then, the antenna 5 (here, the antenna conductor 5X) may be provided beforehand on the surface of the dielectric layer 8 in the reflector block 9 having the reflector 2 and the dielectric layer 8 integrated therein.

The reflector block 9 having the antenna 5 provided therein as described above may be formed by providing the antenna (here, the antenna conductor 5X) on the surface of the dielectric layer 8, loading the dielectric layer 8 with the antenna 5 provided thereon on the reflector 2 including the conductors 2X and 2Y, and then integrating the dielectric layer 8 and the reflector 2.

Note that the reflector block 9 having the antenna 5 provided therein may be formed by loading the dielectric layer 8 with the antenna 5 provided therein on the reflector 2 including the conductors 2X and 2Y after providing the antenna 5 (here, the antenna conductor 5X) on the surface of the dielectric layer 8, and then integrating the dielectric layer 8 with the reflector 2.

Here, as a method for providing the antenna 5 on the surface of the dielectric layer 8, there is a method in which a seed layer formed of Cu and Ti is formed by sputtering, for example, a resist pattern to form the antenna 5 having a desired shape is formed, and then copper (Cu), for example is deposited as a conductor, in other words, a conductive material by electrolytic plating using the seed layer as a feed layer, thereby forming the antenna conductor 5X as the antenna 5 on the surface of the dielectric layer 8.

When using the reflector block 9 having the antenna 5 provided therein as described above, a resist pattern 16A may be formed instead of the resist pattern 16 in the step of forming the resist pattern 16 (see FIG. 5E) in the method for manufacturing a high-frequency module according to the embodiment described above. Specifically, as illustrated in FIG. 11A, the resist pattern 16A has an opening 16AX in a region connected to a line conductor 6B as the rewiring line 6 on the via and the line conductor 6B as the rewiring line 6 and the antenna conductor 5X as the antenna 5. Thus, as illustrated in FIG. 11B, the via 6A may be formed on the terminal 1X of the semiconductor chip 1, and the line conductor 6B may be formed on the photosensitive resin layer 10 as the rewiring line 6 that is a transmission line electrically connecting the semiconductor chip 1 to the antenna 5. Note that, here, the rewiring line 6 includes a seed layer 6C provided below the line conductor 6B.

Moreover, in the embodiment described above, the dielectric layer 8 included in the reflector block 9 included in the integrated body 4 is provided on the entire surface on the antenna 5 side of the reflector 2. However, the embodiment is not limited thereto, but the dielectric layer may be provided on a part of the surface on the antenna side of the reflector.

For example, the dielectric layer included in the reflector block included in the integrated body may be provided so as to be a protrusion part that protrudes from the antenna side of the reflector and includes its end surface exposed on the surface of the integrated body. In this case, the integrated body includes the protrusion part that protrudes from the reflector toward the antenna. In other words, the integrated body includes the protrusion part that protrudes from the antenna side of the reflector and includes its end surface exposed on the surface of the integrated body. The reflector is formed of a conductor, and the protrusion part is formed of a dielectric material. Note that a specific configuration of the protrusion part may be the same as that in a second embodiment to be described later.

The protrusion part thus provided, in other words, the dielectric layer provided as the protrusion part is also to adjust the distance between the reflector and the antenna. Therefore, the protrusion part, in other words, the dielectric layer provided as the protrusion part is also called a distance adjuster. More specifically, the integrated body includes the distance adjuster configured to adjust the distance between the reflector and the antenna. The distance adjuster is the protrusion part that protrudes from the reflector toward the antenna.

Moreover, a region defined by the reflector and the protrusion part in the integrated body may be filled with resin (mold resin). In this case, it is preferable that the antenna is provided on the surface of the resin. Alternatively, the region defined by the reflector and the protrusion part in the integrated body may be filled with a dielectric material. In this case, it is preferable that the antenna is provided on the surface of the dielectric material. Alternatively, the region defined by the reflector and the protrusion part in the integrated body may be an empty space.

When the integrated body includes the protrusion part that protrudes from the reflector toward the antenna as described above, the method for manufacturing a high-frequency module according to the embodiment described above includes a step of providing a protrusion part in the reflector before the step of forming the integrated body. In the step of forming the integrated body, the semiconductor chip and the reflector having the protrusion part provided therein may be integrated by the resin. Moreover, in the step of forming the rewiring layer, a rewiring layer, in other words, a rewiring layer including a rewiring line and the antenna or a rewiring layer including a rewiring line may be formed on the surface of the integrated body on the side where the protrusion part is exposed.

In the embodiment described above, the rewiring line 6 includes the line conductor 6B electrically connected to the semiconductor chip 1 through the via 6A provided in the resin layer 10 formed on the resin 3, and the antenna 5 includes the antenna conductor 5A connected to the line conductor 6B. However, the embodiment is not limited thereto. For example, the rewiring line may include a line conductor electrically connected to the semiconductor chip through a via formed in a dielectric film (resin film; insulating film) provided on the resin, and the antenna may include an antenna conductor connected to the line conductor. The rewiring line and antenna including such configurations may be provided by providing the dielectric film having a conductor layer (for example, a metal layer such as a copper foil), for example, on the resin in the integrated body, forming the line conductor and antenna conductor by patterning the conductor layer, and forming the via in the dielectric film. For example, the rewiring line and the antenna may be provided by patterning a metal layer after attaching a dielectric film onto the resin in the integrated body, the dielectric film having the metal layer attached thereto through an adhesive layer, and then forming the via in the dielectric film. Here, it is preferable that the dielectric film is formed of a low-permittivity dielectric material (low-permittivity material) or a low-loss dielectric material (low-loss material). It is preferable that the dielectric film is formed of a material selected from a group consisting of benzocyclobutene (BCB), liquid crystal polymer, cycloolefin polymer (COP), and fluorine resin typified by polyolefin, polyphenylene ether (PPE), polystyrene and polytetrafluoroethylene (PTFE). As the metal layer, copper or copper alloy, for example, may be used. Alternatively, a metal foil may be used as the metal layer. Note that the metal layer may be formed by sputtering, electroless plating, electroplating or the like, for example. As the adhesive layer, a material such as a compound containing a nitro group, a carboxy group or a cyano group (for example, nitrobenzoic acid, cyanobenzoic acid or the like) may be used. Also, a silane coupling agent containing a mercapto group and an amino group, triazinethiol containing a mercapto group, or the like may also be used. Note that it does not matter which one of the patterning of the conductor layer and the formation of the via is performed first.

The rewiring line and the antenna may be provided by attaching a dielectric film onto the resin in the integrated body, the dielectric film including the rewiring line and antenna patterned thereon. For example, the rewiring line and the antenna may be provided by providing a dielectric film having a via, a line conductor and an antenna conductor on the resin in the integrated body. For example, a dielectric film, on which a line conductor and a via as the rewiring line and an antenna conductor as the antenna are patterned, may be attached with an adhesive onto the resin in the integrated body. In this case, it is preferable to use a conductive adhesive to attach the via patterned on the dielectric film and a region in the vicinity thereof, and to use a low-permittivity and low-loss adhesive to attach the other region. However, in consideration of costs and mounting accuracy, it is preferable to provide the rewiring line and the antenna by using a method in which the rewiring line is patterned after the dielectric film is attached onto the resin in the integrated body described above.

Second Embodiment

First, with reference to FIGS. 12 to 18D, description is given of a high-frequency module and a manufacturing method thereof according to a second embodiment.

In the high-frequency module according to this embodiment, a configuration of an integrated body is different from that in the first embodiment described above.

Figure 12:
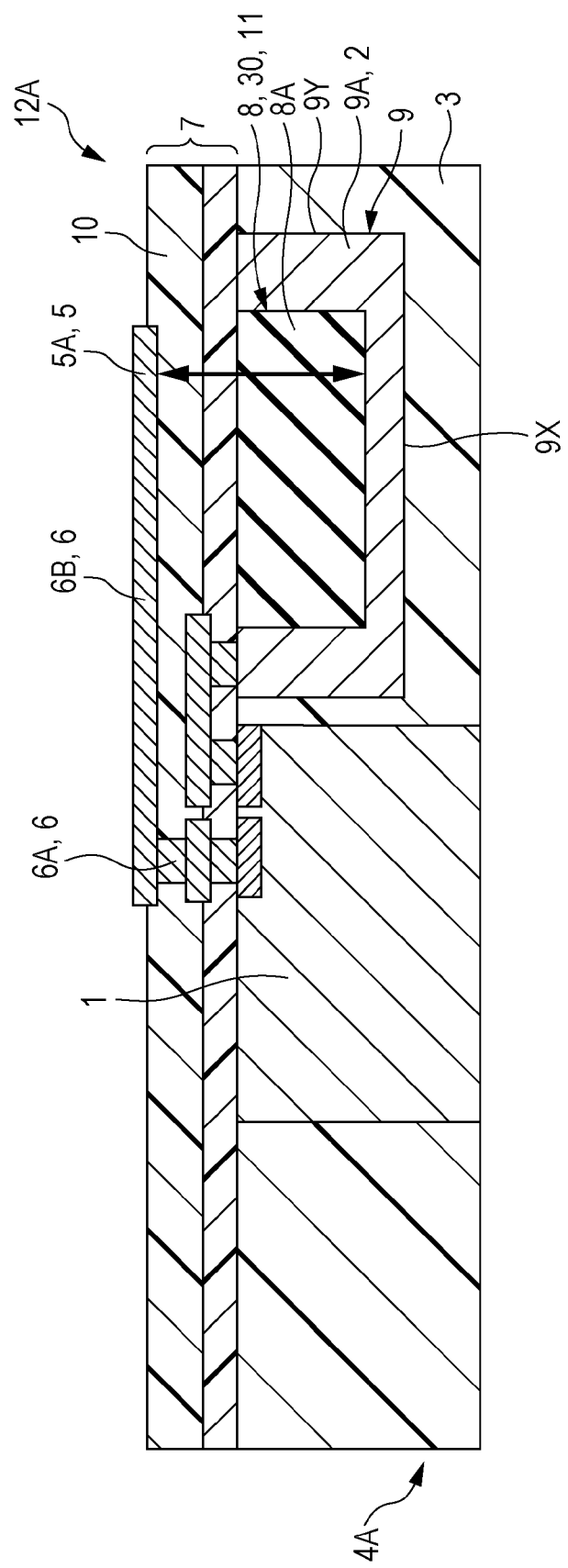
FIG. 12 is a schematic cross-sectional view illustrating a configuration of a high-frequency module according to a second embodiment.
Figure 13:
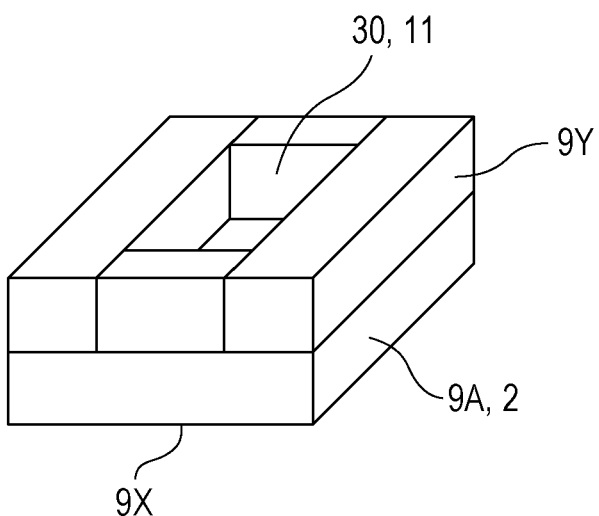
FIG. 13 is a schematic perspective view illustrating a configuration of a reflector block included in the high-frequency module according to the second embodiment.

Specifically, in the first embodiment, the integrated body 4 includes the dielectric layer 8 which comes into contact with the antenna 5 side of the reflector 2 and includes the surface exposed on the surface of the integrated body 4. On the other hand, in this embodiment, an integrated body 4A includes a protrusion part 30 which protrudes from the antenna 5 side of a reflector 2 and includes its end face exposed on the surface of the integrated body 4A, as illustrated in FIGS. 12 and 13.

Moreover, in the first embodiment, the distance adjuster 11 included in the integrated body 4 and configured to adjust the distance between the reflector 2 and the antenna 5 is the dielectric layer 8 provided on the antenna 5 side of the reflector 2. On the other hand, in this embodiment, a distance adjuster 11 included in the integrated body 4A and configured to adjust the distance between the reflector 2 and the antenna 5 is the protrusion part 30 that protrudes from the reflector 2 toward the antenna 5, as illustrated in FIGS. 12 and 13.

To be more specific, in the high-frequency module 12A according to this embodiment, the reflector block 9 has a configuration different from that in the first embodiment described above.

Specifically, in the first embodiment, the reflector block 9 is formed by loading the dielectric layer 8 on the reflector 2 formed of a conductor and integrating the reflector 2 and the dielectric layer 8. On the other hand, in this embodiment, as illustrated in FIGS. 12 and 13, the reflector block 9 is formed by burying a dielectric material 8A in a region (inside) defined by a bottom part 9X and a frame-shaped side part 9Y of a bathtub-shaped metal member 9A having the bottom part 9X and the frame-shaped side part 9Y. Note that the bathtub-shaped metal member 9A is a metal block having a bathtub-shaped, in other words, hollow structure, and is thus also called a bathtub-shaped metal block. Moreover, a bathtub-shaped conductor member formed of a conductor other than metal may be used instead of the bathtub-shaped metal member 9A.

In this case, the bottom part 9X of the bathtub-shaped metal member 9A serves as the reflector 2, and the frame-shaped side part 9Y serves as the protrusion part 30 that protrudes from the reflector 2 toward the antenna 5, in other words, the protrusion part 30 (the distance adjuster 11) that protrudes from the antenna 5 side of the reflector 2 and includes the end face exposed on the surface of the integrated body 4A. The region defined by the reflector 2 and the protrusion part 30 in the integrated body 4A is filled with the dielectric material 8A. The reflector 2 and the protrusion part 30 are formed of metal (conductors).

Here, the bathtub-shaped metal member 9A may be made of copper, for example. Moreover, as the dielectric material 8A buried in the region defined by the bottom part 9X and the frame-shaped side part 9Y of the bathtub-shaped metal member 9A, the same material as that of the dielectric material that forms the dielectric layer 8 included in the reflector block 9 in the first embodiment may be used.

In this case, again, as in the case of the first embodiment, the rewiring line 6 may include the line conductor 6B electrically connected to the semiconductor chip 1 through the via 6A provided in the resin layer 10 formed on the resin 3 included in the integrated body 4. Moreover, the antenna 5 may include the antenna conductor 5A connected to the line conductor 6B as the rewiring line 6.

Note that the embodiment is not limited thereto. For example, the rewiring line 6 may include a line conductor electrically connected to the semiconductor chip through a via formed in a dielectric film (resin film; insulating film) provided on the resin 3. The antenna may include an antenna conductor connected to the line conductor. Moreover, the rewiring line and the antenna may be provided by attaching a dielectric film having the rewiring line and the antenna patterned thereon onto the resin in the integrated body.

Moreover, as in the case of the modified example (see FIG. 10) of the first embodiment, the antenna 5 may be provided beforehand on the surface of the dielectric material 8A in the reflector block 9, in other words, the reflector block 9 in which the dielectric material 8A is buried in the region defined by the bottom part 9X and the frame-shaped side part 9Y of the bathtub-shaped metal member 9A.

Specifically, in this embodiment, the antenna 5 is provided above the reflector block 9 included in the integrated body 4A while sandwiching the resin layer 10 (dielectric layer; insulating layer) included in the rewiring layer 7. In other words, the reflector block 9 is buried in the mold resin 3 immediately below the antenna 5.

Meanwhile, as in the case of the modified example (see FIG. 10) of the first embodiment, the antenna 5, in other words, the antenna conductor 5A may be provided on the surface of the dielectric material 8A included in the reflector block 9 included in the integrated body 4A. As described above, the antenna 5 is provided directly on the surface of the dielectric material 8A included in the reflector block 9 included in the integrated body 4A without sandwiching the resin layer 10 included in the rewiring layer 7. Thus, the influence of the material used for the resin layer 10 included in the rewiring layer 7 on the high-frequency characteristics may be suppressed.

By adopting such a configuration and adjusting the height of the frame-shaped side part 9Y of the bathtub-shaped metal member 9A included in the reflector block 9 included in the integrated body 4A, in other words, the protrusion part 30 that protrudes from the reflector 2 toward the antenna 5 (in other words, the thickness of the dielectric material 8A), the distance between the reflector and the antenna 5 may be adjusted.

With such a configuration, the degree of freedom of design for the distance between the antenna 5 and the reflector 2 may be increased, and thus the antenna efficiency may be improved. Thus, in the high-frequency module with the antenna mounted thereon, a high-performance antenna may be realized when the heterogeneous device integration technology and rewiring technology are applied, which realizes reduction in size and reduces manufacturing variations.

More specifically, when an antenna and a reflector are provided in a rewiring layer, for example (see FIG. 20), a via or the like is preferably provided, and workability is desirably considered. Therefore, it is difficult to freely select the thickness or material of a resin layer (dielectric layer) included in the rewiring layer. For this reason, the degree of freedom of design for the distance between the antenna and the reflector is low, and it is difficult to improve the antenna efficiency.

On the other hand, with the configuration as described above, by adjusting the height of the frame-shaped side part 9Y of the bathtub-shaped metal member 9A, in other words, the protrusion part 30 (here, the thickness of the dielectric material 8A buried inside the bathtub-shaped metal member 9A is determined by the height of the protrusion part 30) that protrudes from the reflector 2 toward the antenna 5, the distance between the reflector 2 and the antenna 5 may be adjusted. The adjustable range is expanded. Moreover, the range of choices for the material of the dielectric material 8A sandwiched between the reflector 2 and the antenna 5 is expanded. Thus, the degree of freedom of design for the distance between the antenna 5 and the reflector 2 may be increased, and the antenna efficiency may be improved.

For example, based on the height of the frame-shaped side part 9Y of the bathtub-shaped metal member 9A included in the reflector block 9 included in the integrated body 4A, in other words, the protrusion part 30 (here, the thickness of the dielectric material 8A buried inside the bathtub-shaped metal member 9A is determined by the height of the protrusion part 30) that protrudes from the reflector 2 toward the antenna 5, the distance between the antenna 5 and the reflector 2 may be set so as to improve the antenna efficiency for the wavelength of a high-frequency signal to be transmitted.

When an antenna and a reflector are provided in a rewiring layer, for example (see FIG. 20), the thickness of the resin layer (dielectric layer) included in the rewiring layer is small, in other words, the distance between the antenna and the reflector is short. Therefore, coupling between the antenna and the reflector is increased, making it difficult for radio waves to be radiated into the space. As a result, the antenna efficiency is reduced. However, the thickness of the dielectric layer included in the rewiring layer may only be increased to about 10 μm. Therefore, the distance between the antenna and the reflector may not be increased. For this reason, it is difficult to realize a high-performance antenna by improving the antenna efficiency. Moreover, the via is increased in length when the dielectric layer included in the rewiring layer is increased in thickness. This leads to reduction in reliability and reduction in electrical characteristics. Thus, it is not preferable to increase the thickness of the dielectric layer.

On the other hand, as in the case of this embodiment, the bathtub-shaped metal member 9A having the dielectric material 8A buried therein is buried in the mold resin 3 and provided inside the integrated body 4A. Thus, the distance between the antenna 5 and the reflector 2 may be increased. Thus, the coupling between the antenna 5 and the reflector 2 is reduced. As a result, the antenna efficiency (antenna characteristics) is improved, and thus a high-performance antenna may be realized.

Figure 14:
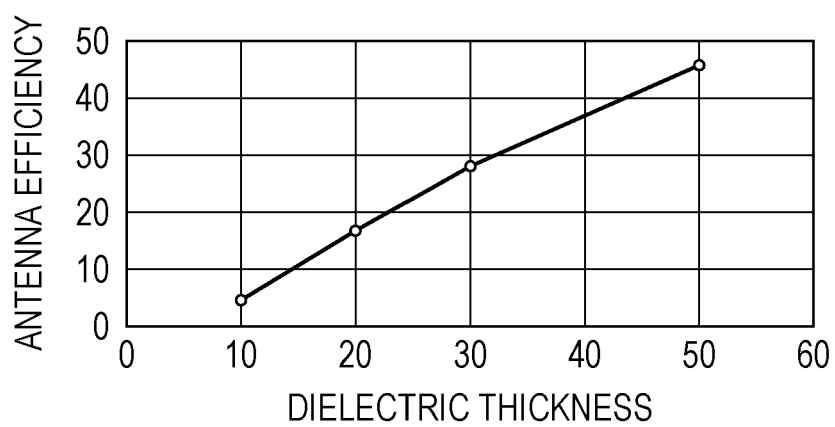
FIG. 14 is a graph illustrating a result of simulation on how antenna efficiency changes with respect to the dielectric thickness.

Here, FIG. 14 illustrates a result of simulation of how the antenna efficiency (radiation efficiency) changes with respect to the thickness of the dielectric material.

Here, a dielectric material having a relative permittivity of about 3.4 and a dielectric tangent of about 0.01 in a millimeter-wave band (80 GHz band) of a frequency 80 GHz is used. Also, a metal conductor serving as an antenna and a reflector is made of copper, and the thickness thereof is set to about 10 μm.

As a result of the simulation, as illustrated in FIG. 14, the antenna efficiency is as low as about 4.6% when the thickness of the dielectric material (the distance between the antenna and the reflector) is about 10 μm. On the other hand, the antenna efficiency is increased as the thickness of the dielectric material is increased. More specifically, the antenna efficiency is about 16.6% when the thickness of the dielectric material is increased to about 20 μm. The antenna efficiency is about 27.8% when the thickness of the dielectric material is increased to about 30 μm. The antenna efficiency is about 45.4% when the thickness of the dielectric material is increased to about 50 μm. The larger the thickness of the dielectric material, the higher the antenna efficiency.

The antenna efficiency may be improved by increasing the thickness of the dielectric material as described above. However, when the antenna and the reflector are provided in the rewiring layer as described above (see FIG. 20), the thickness of the dielectric layer included in the rewiring layer may only be increased to about 10 μm. As a result, the antenna efficiency is low.

On the other hand, as in the case of this embodiment, the bathtub-shaped metal member 9A having the dielectric material 8A buried therein is buried in the mold resin 3 and provided inside the integrated body 4A. Thus, the distance between the antenna 5 and the reflector 2 may be increased compared with the case where the antenna and the reflector are provided in the rewiring layer (see FIG. 20). Moreover, unlike the material used for the resin layer (dielectric layer) included in the rewiring layer 7, the dielectric material 8A buried inside the bathtub-shaped metal member 9A may be freely selected, and a material having good high-frequency characteristics may be used. Thus, the antenna efficiency may be increased.

Particularly, considering the simulation result described above, it is preferable that the thickness of the dielectric material, in other words, the distance between the antenna 5 and the reflector 2 is set to about 50 μm or more.

Meanwhile, the simulation result indicates only up to the case where the thickness of the dielectric material is increased to about 50 μm. However, the antenna efficiency is improved as the thickness of the dielectric material is increased up to the thickness corresponding to about ¼ of the wavelength. In the 80 GHz band, for example, when the relative permittivity is 3.4, ¼ of the wavelength is about 600 μm. Thus, the antenna efficiency is improved as the thickness of the dielectric material is increased up to about 600 μm. However, when the thickness of the dielectric material, in other words, the distance between the antenna and the reflector is increased larger than about 200 μm, the impedance of the antenna is increased, leading to an increase in matching loss due to impedance matching in a matching circuit. Thus, it is preferable that the thickness of the dielectric material, in other words, the distance between the antenna and the reflector is set to about 200 μm or less.

As described above, in the 80 GHz band, it is preferable that the thickness of the dielectric material, in other words, the distance between the antenna and the reflector is set to about 50 μm to 200 μm.

Note that, although the description is given here taking as an example the case of the 80 GHz band, the embodiment is not limited thereto. In other frequency bands, the antenna efficiency is similarly improved as the thickness of the dielectric material, in other words, the distance between the antenna and the reflector is increased up to the thickness corresponding to about ¼ of the wavelength. Meanwhile, when the thickness of the dielectric material, in other words, the distance between the antenna and the reflector is increased too much, the input impedance to the antenna is increased, making it difficult to achieve impedance matching between the antenna and the circuit. As a result, the matching loss is increased. Therefore, it is preferable that, considering the balance between the antenna efficiency and the matching loss, the thickness of the dielectric material, in other words, the distance between the antenna and the reflector is set to an optimum value. Moreover, the higher the permittivity of the dielectric material provided between the antenna and the reflector, the shorter the wavelength. This leads to an advantage that the physical size of the antenna may be reduced. However, the larger the permittivity, the larger the gap with the permittivity of the air. Therefore, the resonance within the dielectric material is increased, making it difficult for radiation into the air to occur. Thus, if the physical size of the antenna is permitted in the desirable specifications, it is preferable to use a dielectric material having a low permittivity.

Figure 15:
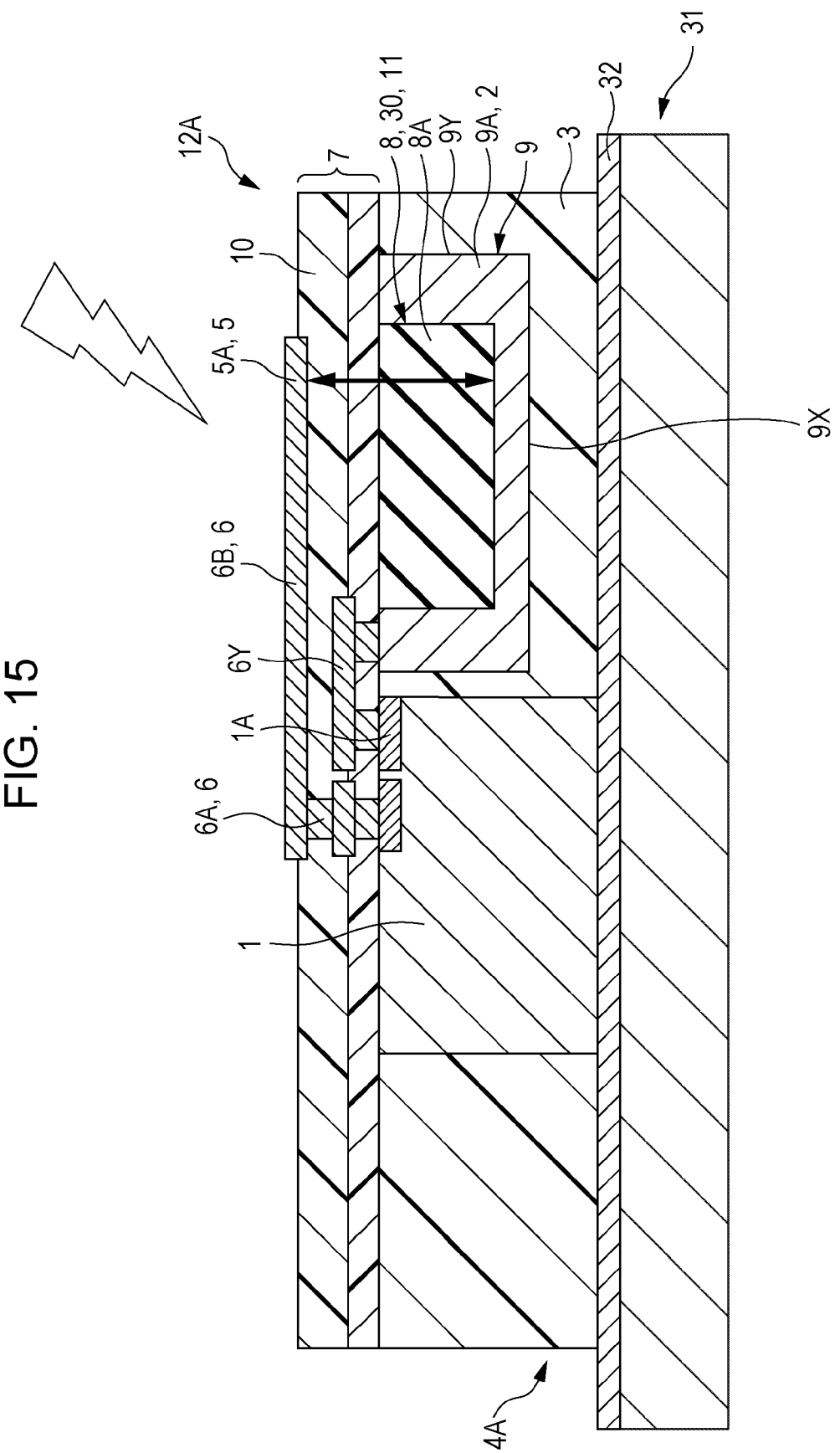
FIG. 15 is a schematic cross-sectional view illustrating an example of a mode of mounting the high-frequency module according to the second embodiment.

Meanwhile, the high-frequency module 12A according to the embodiment described above is mounted on a substrate 31 (mounting substrate) such as a PCB, as illustrated in FIG. 15, for example.

This mounting mode is face-up mounting, in which the rear surface side of the semiconductor chip 1 is used as the ground, and the high-frequency module 12A according to the embodiment described above is mounted on the substrate 31 so as to electrically connect the rear surface side of the semiconductor chip 1 to the ground 32 provided on the substrate 31.

More specifically, in the high-frequency module 12A according to the embodiment described above, the reflector 2 includes the bottom part 9X of the bathtub-shaped metal member 9A, the frame-shaped side part 9Y is connected to the bottom part 9X of the bathtub-shaped metal member 9A, and the end face of the frame-shaped side part 9Y is exposed on the surface of the integrated body 4A. Therefore, as illustrated in FIG. 15, the end face of the frame-shaped side part 9Y of the bathtub-shaped metal member 9A and the ground terminal 1A of the semiconductor chip 1 may be electrically connected through the rewiring line 6Y included in the rewiring layer 7. Thus, the reflector 2 may be electrically connected to the ground 32 provided on the substrate 31 through the semiconductor chip 1. Accordingly, in mounting the high-frequency module 12A according to the embodiment described above on the substrate 31, the high-frequency module 12A according to the embodiment described above may be mounted on the substrate 31 through a conductive adhesive or the like, for example, so as to electrically connect the rear surface side of the semiconductor chip 1 to the ground 32 provided on the substrate 31.

In this case, since the antenna 5 is positioned above the high-frequency module 12A mounted on the substrate 31, radio waves radiated from the antenna are radiated upward.

Moreover, although not illustrated, since the circuit surface of the semiconductor chip 1 is also positioned above the high-frequency module 12A mounted on the substrate 31, input and output of signals and bias supply to the semiconductor chip 1 are performed by electrically connecting the semiconductor chip 1 to the substrate 31 through bonding wires, for example.

Note that the embodiments are not limited thereto.

Figure 16:
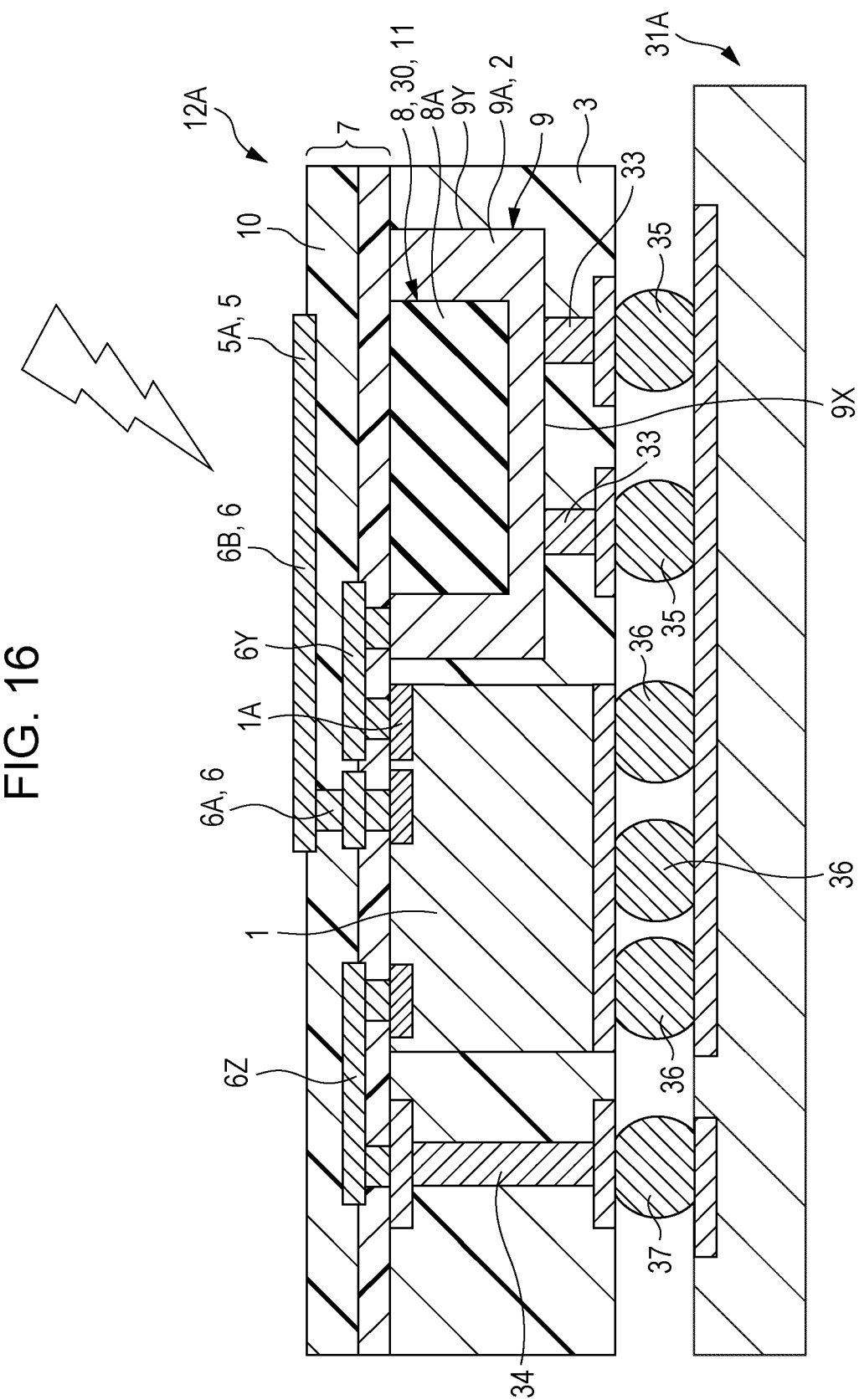
FIG. 16 is a schematic cross-sectional view illustrating another example of a mode of mounting the high-frequency module according to the second embodiment.

For example, as illustrated in FIG. 16, the high-frequency module 12A according to the embodiment described above may be mounted on a substrate 31A.

In this mounting mode, conductor pins 33 and 34 are buried in the mold resin 3 included in the integrated body 4A. The rear surface side of the high-frequency module 12A according to the embodiment described above is electrically connected to the substrate 31A through the conductor pins 33 and 34, a rewiring line 6Z and solder bumps 35 to 37. Thus, input and output of signals, bias supply and connection to the ground are performed. In this case, in the step of forming the integrated body 4A included in the method for manufacturing the high-frequency module 12A according to the embodiment described above, the conductor pins 33 and 34 may be buried so as to penetrate the mold resin 3 to the surface on the side opposite to the side where the rewiring layer 7 is provided.

This mounting mode is also face-up mounting. Since the antenna 5 is positioned above the high-frequency module 12A mounted on the substrate 31A, radio waves radiated from the antenna 5 are radiated upward.

Figure 17:
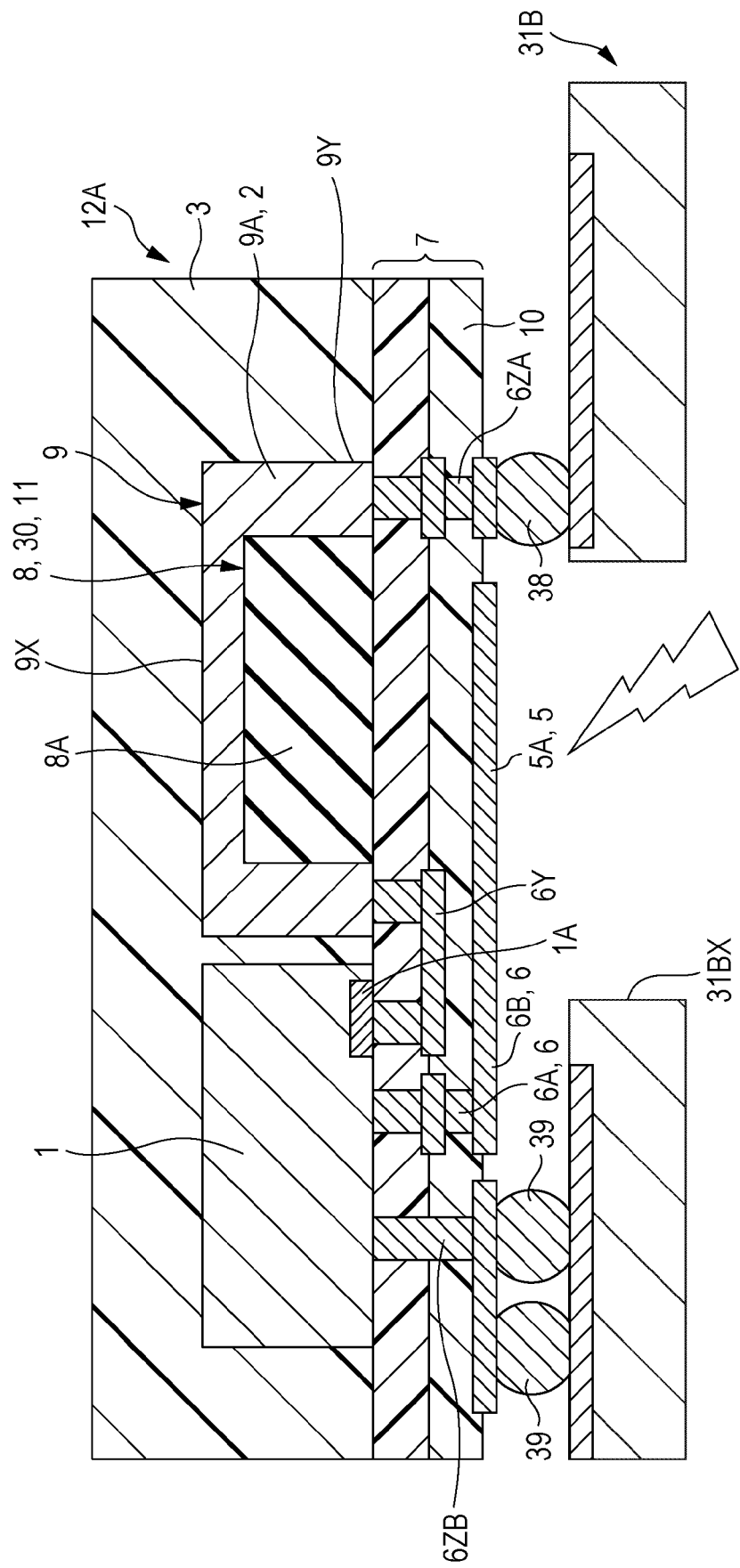
FIG. 17 is a schematic cross-sectional view illustrating another example of a mode of mounting the high-frequency module according to the second embodiment.

Alternatively, as illustrated in FIG. 17, for example, the high-frequency module 12A according to the embodiment described above may be mounted on a substrate 31B. In this mounting mode, the front surface side of the high-frequency module 12A according to the embodiment described above is electrically connected to the substrate 31B through rewiring lines 6ZA and 6ZB and solder bumps 38 and 39 provided in the rewiring layer 7. Thus, input and output of signals, bias supply and connection to the ground are performed. In this case, in the step of forming the rewiring layer 7 included in the method for manufacturing the high-frequency module 12A according to the embodiment described above, the rewiring lines 6ZA and 6ZB may be provided to perform the input and output of signals, bias supply and connection to the ground.

This mounting mode is flip chip mounting of the high-frequency module 12A according to the embodiment described above on the substrate 31B. This mounting mode is face-down mounting. Since the antenna 5 is positioned below the high-frequency module 12A mounted on the substrate 31B, radio waves radiated from the antenna 5 are radiated downward. Thus, in order to reduce blocking of the radio waves radiated from the antenna by the substrate 31B, the substrate 31B is used, which has an opening 31BX in a path of the radio waves radiated from the antenna.

Note that, since other details are the same as those in the first embodiment and the modified example, description thereof is omitted here.

Note that, as in this embodiment described above, when the reflector block 9 is formed by burying the dielectric material 8A in the region defined by the bottom part 9X and the frame-shaped side part 9Y of the bathtub-shaped metal member 9A, the step of forming the reflector block 9 serves as the step of providing the protrusion part 30 in the reflector 2 performed before the step of forming the integrated body 4 included in the method for manufacturing the high-frequency module according to the first embodiment. Moreover, the step of forming the integrated body 4A by integrating the semiconductor chip 1 and the reflector block 9 as described above with the resin 3 serves as the step of forming the integrated body 4A by integrating the semiconductor chip 1 and the reflector 2 having the protrusion part 30 provided therein with the resin 3. Furthermore, the step of forming the rewiring layer 7 on the surface, of the reflector block 9 in the integrated body 4A, where the end face of the frame-shaped side part 9Y is exposed serves as the step of forming the rewiring layer 7 on the surface of the integrated body 4A where the protrusion part 30 is exposed.

Therefore, the high-frequency module and the manufacturing method thereof according to this embodiment have an advantage of increasing the degree of freedom of design for the distance between the antenna 5 and the reflector 2 and thus improving the antenna efficiency, as in the case of the first embodiment and the modified example described above.

Note that, in the embodiment described above, the reflector block 9 is formed by burying the dielectric material 8A in the region (inside) defined by the bottom part 9X and the frame-shaped side part 9Y of the bathtub-shaped metal member 9A. However, the embodiment is not limited thereto.

For example, in the reflector block 9, the region (inside) defined by the bottom part 9X and the frame-shaped side part 9Y of the bathtub-shaped metal member 9A may be an empty space. In other words, the region defined by the reflector 2 and the protrusion part 30 in the integrated body 4A may be an empty space.

In this case, a dielectric film (resin film; insulating film) may be used for the rewiring layer 7, and an opening above the reflector block 9, in other words, an opening above the bathtub-shaped metal member 9A may be covered with and closed by the dielectric film included in the rewiring layer 7. As described above, the region defined by the bottom part 9X and the frame-shaped side part 9Y of the bathtub-shaped metal member 9A may be set to be an empty space, thereby allowing the air having a low permittivity to exist therein.

In this case, the rewiring line 6 may be formed of a line conductor electrically connected to the semiconductor chip 1 through a via formed in the dielectric film provided on the resin 3. The antenna 5 may be formed of an antenna conductor to be connected to the line conductor. Alternatively, a dielectric film having a rewiring line and an antenna patterned thereon may be attached onto the resin in the integrated body, thereby providing the rewiring line and the antenna.

Alternatively, in the reflector block 9, for example, the region (inside) defined by the bottom part 9X and the frame-shaped side part 9Y of the bathtub-shaped metal member 9A may be filled with a resin (mold resin 3). In other words, the region defined by the reflector 2 and the protrusion part 30 in the integrated body 4A may be filled with the resin (mold resin 3). In this case, the antenna 5 is preferably provided on the surface of the resin (mold resin 3).

In this case, in the step of forming the integrated body 4A included in the method for manufacturing a high-frequency module, a hole 40 may be provided in the bottom part 9X or the side part 9Y of the bathtub-shaped metal member 9A (bathtub-shaped conductor member) in the embodiment described above, as illustrated in FIG. 18A, so as to allow the mold resin 3 used to form the integrated body 4A to flow into the inside.

Figure 18A:
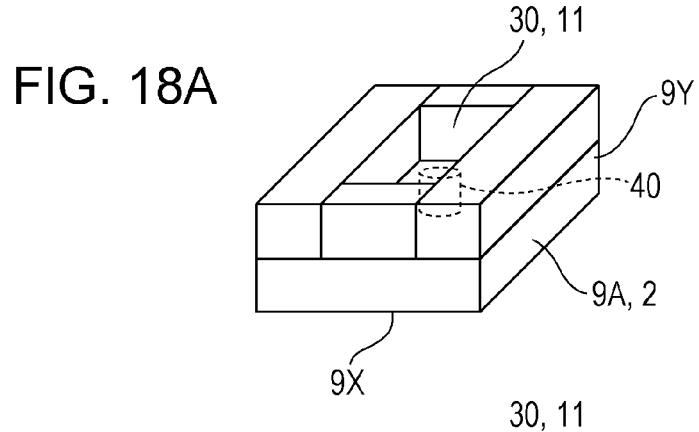
FIGS. 18A to 18D are schematic perspective views illustrating a configuration of a modified example of the reflector block included in the high-frequency module according to the second embodiment.
Figure 18B:
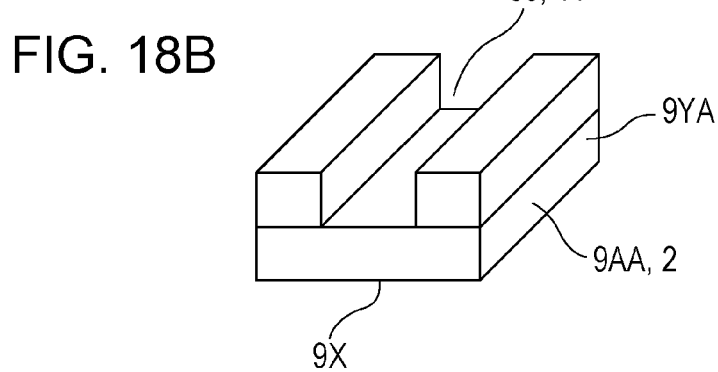
Figure 18C:
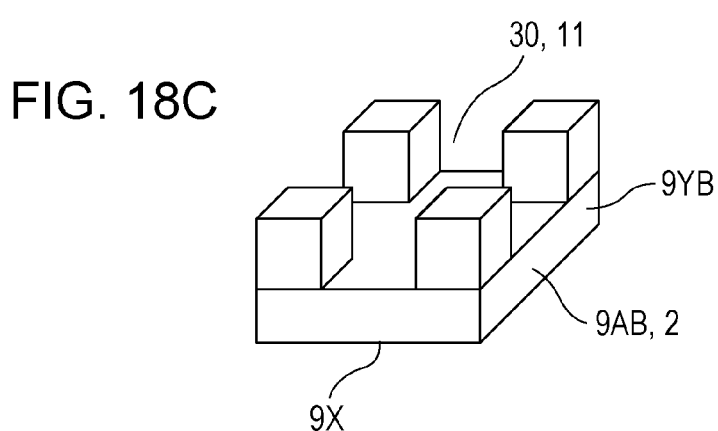
Figure 18D:
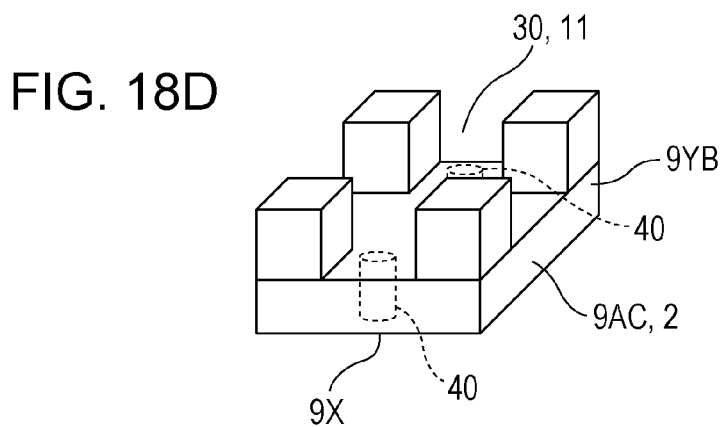

Moreover, instead of the bathtub-shaped metal member 9A in the embodiment described above, a U-shaped cross-section metal member 9AA (U-shaped cross-section conductor member) may be used, having slits that allows the mold resin 3 to flow from one side and the opposite side, and also having protrusion parts 9YA along two sides of the bottom part 9X, as illustrated in FIG. 18B, for example. Moreover, instead of the bathtub-shaped metal member 9A in the embodiment described above, a metal member 9AB (conductor member) may be used, having slits that allows the mold resin 3 to flow from four sides, and also having protrusion parts 9YB at four corners of the bottom part 9X, as illustrated in FIG. 18C, for example. Alternatively, a metal member 9AC (conductor member) may be used, having protrusion parts 9YB at four corners of the bottom part 9X and a hole 40 in the bottom part 9X to allow the mold resin 3 to flow, as illustrated in FIG. 18D, for example. Note that the metal members 9A, 9AA, 9AB, and 9AC described above are disposed so that the bottom part 9X is located above, and integrated with the mold resin 3, in the step of forming the integrated body 4A. In this event, the metal members are supported by the side part 9Y or the protrusions 9YA and 9YB. Therefore, in order to stabilize the position during integration with the resin 3, the side part 9Y and the protrusions 9YA and 9YB are preferably provided.

In the case of using such metal members 9A, 9AA, 9AB, and 9AC, again, the bottom part 9X of each of the metal members 9A, 9AA, 9AB, and 9AC serves as the reflector 2, and the side part 9Y or the protrusions 9YA and 9YB serve as the protrusion part 30 that protrudes from the reflector 2 toward the antenna 5, in other words, the protrusion part 30 (distance adjuster 11) that protrudes from the antenna 5 side of the reflector 2 and has the end face exposed on the surface of the integrated body 4A. Also, the region defined by the reflector 2 and the protrusion part 30 in the integrated body 4A is filled with the resin (mold resin 3). Moreover, the reflector 2 and the protrusion part 30 are formed of metal (conductors).

Note that, in the case of using such metal members 9A, 9AA, 9AB, and 9AC, the reflector block 9 may be formed by providing a resin or dielectric material different from the mold resin 3 used to form the integrated body 4A. Moreover, the space may be left as an empty space.

Others

Note that the embodiments are not limited to the configurations described in the embodiments and modified examples described above, but various changes may be made without departing from the scope of the embodiments.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:
1. A high-frequency module comprising:
   an integrated body including a semiconductor chip and a reflector, the semiconductor and the reflector being integrated by a resin;
   an antenna provided with a space from the reflector; and
   a rewiring layer provided on the surface of the integrated body, the rewiring layer including a rewiring line electrically coupling the semiconductor chip to the antenna.

2. The high-frequency module according to claim 1, wherein
   the integrated body includes a distance adjuster configured to adjust a distance between the reflector and the antenna.
3. The high-frequency module according to claim 2, wherein
   the distance adjuster is a dielectric layer provided on the antenna side of the reflector.
4. The high-frequency module according to claim 1, wherein
   the integrated body includes a dielectric layer that comes into contact with the antenna side of the reflector, the dielectric layer including a surface exposed on the surface of the integrated body.
5. The high-frequency module according to claim 3, wherein
   the antenna is provided on the surface of the dielectric layer.
6. The high-frequency module according to claim 2, wherein
   the distance adjuster is a protrusion part configured to protrude from the reflector toward the antenna.
7. The high-frequency module according to claim 1, wherein
   the integrated body includes a protrusion part configured to protrude from the antenna side of the reflector, the protrusion part including an end face exposed on the surface of the integrated body.
8. The high-frequency module according to claim 6, wherein
   the reflector and the protrusion part are formed of conductors.
9. The high-frequency module according to claim 6, wherein
   the reflector is formed of a conductor, and
   the protrusion part is formed of a dielectric material.
10. The high-frequency module according to claim 6, wherein
    a region defined by the reflector and the protrusion part in the integrated body is filled with the resin.
11. The high-frequency module according to claim 10, wherein
    the antenna is provided on the surface of the resin.
12. The high-frequency module according to claim 6, wherein
    a region defined by the reflector and the protrusion part in the integrated body is filled with a dielectric material.
13. The high-frequency module according to claim 12, wherein
    the antenna is provided on the surface of the dielectric material.
14. The high-frequency module according to claim 6, wherein
    a region defined by the reflector and the protrusion part in the integrated body is an empty space.
15. A method for manufacturing a high-frequency module, the method comprising:
    forming an integrated body by integrating a semiconductor chip with a reflector by a resin; and
    forming a rewiring layer on the surface of the integrated body, the rewiring layer including a rewiring line electrically coupling the semiconductor chip to an antenna provided with a space from the reflector.
16. The method for manufacturing a high-frequency module according to claim 15,
    wherein, in the forming the integrated body, the semiconductor chip, the reflector and a distance adjuster configured to adjust a distance between the reflector and the antenna are integrated by the resin to form the integrated body, and in the forming the rewiring layer, the rewiring layer is formed on the surface of the integrated body on the side where the distance adjuster is exposed.

17. The method for manufacturing a high-frequency module according to claim 15, the method further comprising:

providing a dielectric layer in the reflector before the forming the integrated body, wherein, in the forming the integrated body, the semiconductor chip and the reflector having the dielectric layer provided therein are integrated by the resin to form the integrated body, and in the forming the rewiring layer, the rewiring layer is formed on the surface of the integrated body on the side where the dielectric layer is exposed.

18. The method for manufacturing a high-frequency module according to claim 17, wherein, in the forming the rewiring layer, the antenna is formed on the surface of the dielectric layer.

19. The method for manufacturing a high-frequency module according to claim 15, the method further comprising:

providing a dielectric layer in the reflector and providing the antenna on the surface of the dielectric layer before the forming the integrated body, wherein, in the forming the integrated body, the semiconductor chip and the reflector having the dielectric layer and the antenna provided therein are integrated by the resin to form the integrated body, and in the forming the rewiring layer, the rewiring layer is formed on the surface of the integrated body on the side where the antenna is exposed.

20. The method for manufacturing a high-frequency module according to claim 15, the method further comprising:

providing a protrusion part in the reflector before the forming the integrated body, wherein, in the forming the integrated body, the semiconductor chip and the reflector having the protrusion part provided therein are integrated by the resin to form the integrated body, wherein, in the forming the rewiring layer, the rewiring layer is formed on the surface of the integrated body on the side where the protrusion part is exposed.

* * * * *